United States Patent
Gomm

(10) Patent No.: US 6,937,076 B2
(45) Date of Patent: Aug. 30, 2005

(54) CLOCK SYNCHRONIZING APPARATUS AND METHOD USING FREQUENCY DEPENDENT VARIABLE DELAY

(75) Inventor: Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 10/459,851

(22) Filed: Jun. 11, 2003

(65) Prior Publication Data

US 2004/0251936 A1 Dec. 16, 2004

(51) Int. Cl.[7] .............................................. H03L 7/06
(52) U.S. Cl. .................... 327/158; 327/141; 327/159; 327/161
(58) Field of Search ...................... 327/141, 144–7, 327/149, 150, 153, 155, 156, 158, 159, 161, 270, 231, 276, 277; 331/1 A, 17, 25

(56) References Cited

U.S. PATENT DOCUMENTS

| | | | |
|---|---|---|---|
| 4,965,810 A | 10/1990 | Peischl et al. ................ | 375/80 |
| 5,077,686 A | 12/1991 | Rubinstein .................. | 395/550 |
| 5,233,316 A | 8/1993 | Yamada et al. .............. | 331/45 |
| 5,574,508 A | 11/1996 | Diamant ..................... | 348/511 |
| 5,614,845 A | 3/1997 | Masleid ...................... | 326/93 |
| 5,675,273 A | 10/1997 | Masleid ...................... | 327/156 |
| 5,757,218 A | 5/1998 | Blum ......................... | 327/175 |
| 5,910,740 A | 6/1999 | Underwood ................ | 327/149 |
| 5,923,715 A * | 7/1999 | Ono ........................... | 375/376 |
| 5,946,244 A | 8/1999 | Manning ..................... | 365/194 |
| 5,955,905 A | 9/1999 | Idei et al. ................... | 327/160 |
| 5,969,552 A * | 10/1999 | Lee et al. ................... | 327/158 |
| 6,069,508 A | 5/2000 | Takai ......................... | 327/161 |
| 6,087,868 A | 7/2000 | Millar ........................ | 327/156 |
| 6,107,891 A | 8/2000 | Coy .......................... | 331/18 |

(Continued)

OTHER PUBLICATIONS

Chae, Jeong–Seok et al., "Wide Range Single–Way–Pumping Synchronous Mirror Delay", IEEE Electronics Letter Online No. 20000711, Feb. 11, 2000, pp. 939–940.

Jang, Seong–Jin et al., A Compact Ring Delay Line for High Speed Synchronous DRAM, IEEE Symposium on VLSI Circuits Digest of Technical Papers, 1998, pp. 60–61.

Kuge, Shigehiro et al., "A 0.18 μm 256Mb DDR–SDRAM with Low–Cost Post–Mold–Tuning Method for DLL Replica", IEEE International Solid–State Circuits Conference, Feb. 2000, pp. 402–403.

Saeki, Takanori et al., "A 2.5ns Clock Access 250MHz 256Mb SDRAM with a Synchronous Mirror Delay", IEEE International Solid–State Circuits Conference, Feb. 1996, pp. 374–375.

Takai, Yasuhiro et al., A 250Mb/s/pin 1Gb Double Data Rate SDRAM with a Bi–Directional Delay and an Inter–Bank Shared Redundancy Scheme, 1999.

Shigehiro, K. et al., "A 0.18 –μm 256–Mb DDR–SDRAM with Low–Cost Post–mold Tuning Method for DLL Replica", IEEE Journal of Solid–State Circuits, vol. 35, No. 11, Nov. 2000, pp. 1680–1689.

Primary Examiner—Timothy P. Callahan
Assistant Examiner—An T. Luu
(74) Attorney, Agent, or Firm—Dorsey & Whitney LLP

(57) ABSTRACT

A clock signal generator providing an output clock signal synchronized with an input clock signal having an input clock frequency including a frequency dependent variable delay line to accommodate a wide range of operating frequencies. A clock signal synchronized with an input clock signal propagated through an input time delay and an output time delay is generated by delaying an input buffered clock signal by a first time delay based on the frequency of the input buffered clock signal, and further delaying the delayed input buffered clock signal by a second time delay to compensate for timing skew introduced by the input time delay, the output time delay and the process of delaying the input buffered clock signal.

65 Claims, 10 Drawing Sheets

U.S. PATENT DOCUMENTS

| | | | | |
|---|---|---|---|---|
| 6,150,856 | A | 11/2000 | Morzano | 327/149 |
| 6,194,932 | B1 | 2/2001 | Takemae et al. | 327/158 |
| 6,239,641 | B1 | 5/2001 | Lee | 327/270 |
| 6,240,042 | B1 | 5/2001 | Li | 365/233 |
| 6,304,117 | B1 | 10/2001 | Yamazaki et al. | 327/158 |
| 6,310,822 | B1 | 10/2001 | Shen | 365/233 |
| 6,323,705 | B1 | 11/2001 | Shieh et al. | 327/158 |
| 6,330,197 | B1 | 12/2001 | Currin et al. | 365/194 |
| 6,340,904 | B1 | 1/2002 | Manning | 327/156 |
| 6,373,307 | B1 | 4/2002 | Takai | 327/161 |
| 6,378,079 | B1 | 4/2002 | Mullarkey | 713/401 |
| 6,404,248 | B1 | 6/2002 | Yoneda | 327/158 |
| 6,417,715 | B2 | 7/2002 | Hamamoto et al. | 327/291 |
| 6,426,900 | B1 | 7/2002 | Maruyama et al. | 365/194 |
| 6,445,231 | B1 | 9/2002 | Baker et al. | 327/158 |
| 6,476,653 | B1 * | 11/2002 | Matsuzaki | 327/158 |
| 6,480,047 | B2 | 11/2002 | Abdel-Maguid et al. | 327/161 |
| 6,484,268 | B2 | 11/2002 | Tamura et al. | 713/600 |
| 6,490,207 | B2 | 12/2002 | Manning | 365/194 |
| 6,509,776 | B2 * | 1/2003 | Kobayashi et al. | 327/277 |
| 6,556,489 | B2 | 4/2003 | Gomm et al. | 365/194 |
| 6,605,969 | B2 * | 8/2003 | Mikhalev et al. | 327/158 |
| 6,693,472 | B2 * | 2/2004 | Mikhalev et al. | 327/149 |
| 6,759,911 | B2 * | 7/2004 | Gomm et al. | 331/10 |
| 2002/0167346 | A1 | 11/2002 | Yoon et al. | 327/158 |
| 2002/0176315 | A1 | 11/2002 | Graaff | 365/233 |
| 2002/0180499 | A1 | 12/2002 | Kim et al. | 327/158 |

* cited by examiner

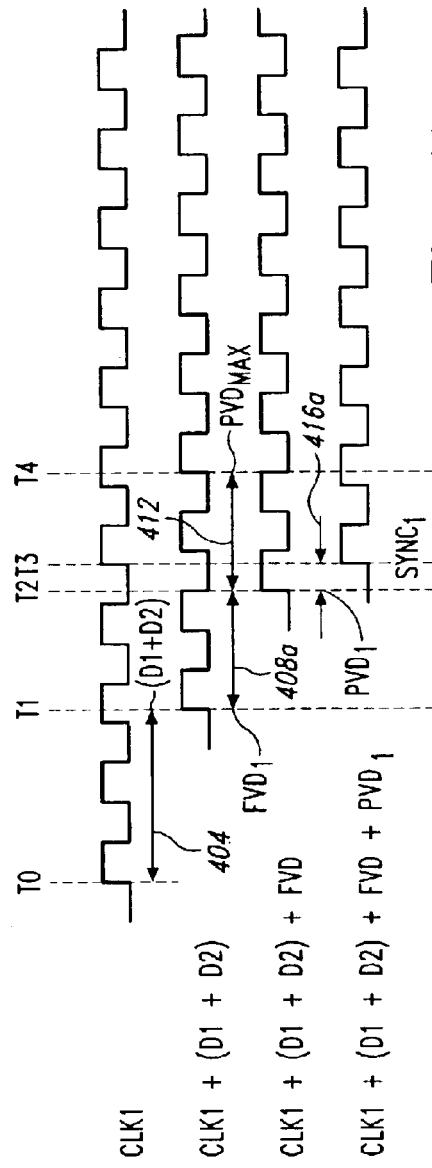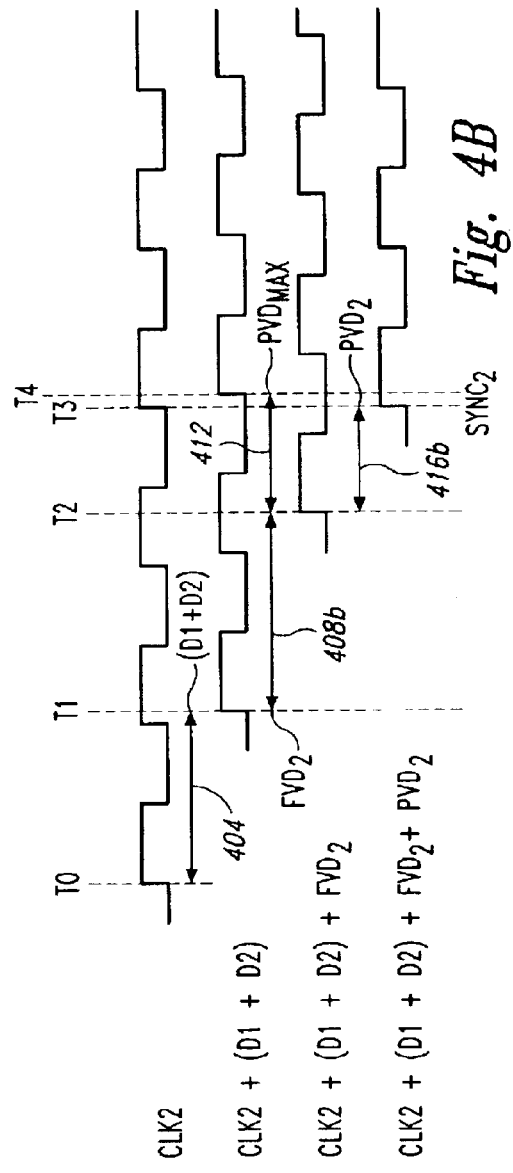

CLOCK SYNCHRONIZING APPARATUS AND METHOD USING FREQUENCY DEPENDENT VARIABLE DELAY

TECHNICAL FIELD

The present invention relates generally to integrated circuits, and more specifically to synchronizing an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, data are placed on a data bus by the memory device in synchronism with the external clock signal, and the memory device must provide the data at the proper times for the data to be valid. To provide the data at the correct times, an internal clock signal is developed in response to the external clock signal, and is typically applied to latches contained in the memory device to thereby clock the data onto the data bus. The internal clock signal and external clock must be synchronized to ensure the internal clock signal clocks the latches at the proper times to successfully output the data at the proper times. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which data can be transferred to and from the memory device, the frequency of the external clock signal is increased, and in modern synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the data applied to the data bus may not be valid at the proper times to be latched.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed. For example, the output buffer 108 may represent all of components in a data path in the memory device through which the data propagates to be provided onto the data bus. The CLKSYNC signal can then be used to clock the output data latches such that the data is provided in synchronicity with the CLK signal applied to the memory device.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning (Manning), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKSYNC signal corresponds to the internal clock signal.

FIG. 2 is a signal timing diagram illustrating various signals generated during operation of the delay-locked loop 100 of FIG. 1. In response to a rising-edge of the CLK signal at a time T0, the CLKBUF signal goes high the delay D1 later at a time T1. Initially, the variable delay VD as a value VD1, causing the CLKDEL signal to go high at a time T3 and the CLKSYNC signal to go high at a time T4. At this point, note that the positive-edge of the CLKSYNC signal at the time T4 is not synchronized with the CLK signal, which transitions high at a time T5. In response to the rising-edge of the CLKDEL signal at the time T3, the CLKFB goes high at a time T6, which occurs before a positive-edge of the CLKBUF signal occurring at a time T7. Thus, the positive-edge of the CLKFB signal occurs at the time T6 while the positive-edge of the CLKBUF occurs at the time T7, indicating there is a phase shift between the two signals. The phase detector 110 (FIG. 1) detects this phase difference, and generates the DCONT signal just after the time T7 at a time T8 which, in turn, causes the delay controller 112 (FIG. 1) to generate the DADJ signal to adjust the value of the variable delay VD to a new value VD2.

In response to the new variable delay VD2, the next rising-edge of the CLKDEL signal occurs at a time T9. The CLKSYNC signal transitions high the delay D2 later at a time T10 and in synchronism with a rising-edge of the CLK signal. At this point, the delay-locked loop 100 is locked. In response to the positive-edge transition of the CLKDEL signal at the time T9, the CLKFB signal transitions high at a time T11 in synchronism with the CLKBUF signal. Once again, the phase detector 110 (FIG. 1) detects the phase difference between the CLKBUF and CLKFB signals, which in this case is approximately zero, and generates the DCONT signal just after the time T11 in response to the detected phase difference. In this situation, the generated DCONT signal would not cause the variable delay VD2 to be adjusted since the delay-locked loop 100 is locked. Moreover, although the relative phases of the CLKBUF and CLKFB signals is detected in response to each rising-edge of these signals, the variable delay VD may not be adjusted immediately even where such a phase difference is detected. For example, the variable delay VD may be adjusted only when a phase difference between the CLKFB and CLKBUF signals exists for a predetermined time or exceeds a predetermined magnitude. In this way, the phase detector 110 and delay controller 112 can provide a sort of "filtering" of jitter or variations in the CLK signal, as will be understood in the art.

In the delay-locked loop 100, each cycle of the CLK signal the phase detector 110 compares rising-edges of the CLKBUF and CLKFB signals and generates the appropriate DCONT signal to incrementally adjust the variable delay VD until the delay-locked loop 100 is locked. The phase detector 110 could also compare falling-edges of the CLKBUF and CLKFB signals, as in the previously mentioned Manning patent. In this way, the delay-locked loop 100 incrementally adjusts the variable delay VD once each cycle of the CLK signal. Although the example of FIG. 2 illustrates the delay-locked loop 100 as locking and therefore synchronizing the CLK and CLKSYNC signals after only two cycles of the CLK signal, the delay-locked loop typically takes as many as 200 cycles of the CLK signal to lock. Before the delay-locked loop 100 is locked, the CLKSYNC signal cannot be used to clock output latches of the synchronous memory device containing the delay-locked loop. As a result, the time it takes to lock the delay-locked loop 100 may slow the operation of the associated synchronous memory device. For example, in a conventional double data rate (DDR) SDRAM, the delay-locked loop is automatically disabled when the SDRAM enters a self-refresh mode of operation. Upon exiting the self-refresh mode, 200 cycles of the applied CLK signal must then occur before data can be provided by the SDRAM.

In the delay-locked loop 100, the variable delay line 102 typically is formed from a number of serially-connected individual delay stages, with individual delay stages being added or removed to adjust the variable delay VD, as will be understood by those skilled in the art. For example, a plurality of serially-connected inverters could be used to form the variable delay line 102, with the output from different inverters being selected in response to the DADJ to control the variable delay VD. A large number of stages in the variable delay line 102 is desirable with each stage having an incremental delay to provide better resolution in controlling the value of the variable delay VD. In addition, the variable delay line 102 must be able to provide the maximum variable delay VD corresponding to the CLK signal having the lowest frequency in the frequency range over which the delay-locked loop is designed to operate. This is true because the variable delay line 102 must provide a variable delay VD of NTCK−(D1+D2), which will have its largest value when the period of the CLK signal is greatest, which occurs at the lowest frequency of the CLK signal.

As previously explained, the delay-locked loop 100 can only operate over a limited frequency range due to the maximum delay available from the variable delay line 102. In many memory device applications, the minimum frequency that a delay-locked loop can accommodate is one-half the maximum operating frequency of the memory device in which the delay-locked loop is located. For example, a synchronous memory device rated at a maximum clock frequency of 100 MHz typically includes a delay-locked loop having a variable delay line that can accommodate a clock frequency as low as 50 MHz. However, in some instances, it may desirable to be able to operate the device at a frequency less than one-half of the maximum operating frequency, or in the case of the previously mentioned synchronous memory device, at a clock frequency less than 50 MHz.

One such instance is for the purpose of power efficiency. It is generally the case that the higher the clock frequency at which a memory device is operated, the higher the power consumed. However, in some memory device applications, the frequency at which a memory device needs to output data does not necessarily need to be at its maximum operating frequency. Thus, it would be advantageous to be able to operate a memory device at lower clock frequency to take advantage of any power savings that may be available. For the greatest power efficiency, the lowest operating frequency that can be sustained will yield the greatest benefit. For example, in the case of computer graphics applications, a high operating frequency is desirable when data needs to be read from and written to memory quickly, such as when significant computation is necessary in generating pixel information for computer graphics images that are changing rapidly. This is the case for many computer video games where there is motion through a world space defined by three-dimensional geometric information that needs to be translated into a two-dimensional image for display. The ability to access data from memory at a high frequency is critical in creating the impression of smooth motion, and consequently, memory devices should be operating at the maximum clock frequency to facilitate the graphics processing. However, operating the graphics system at a low operating frequency may also be desirable under some circumstances, such as when the images are changing relatively slowly, or only a small portion of the pixels displayed need to be modified each time the image is refreshed. An example of this situation is the case of a screen saver where images remain relatively static until refreshed, or where movement is relatively slow. Under these circumstances, the rate at which data can be accessed from a memory device can be considerably slower, and consequently, operating the memory of the graphics system at a lower frequency than in the situation where high frequency is desirable will yield power savings.

As previously discussed, the rate at which data is provided by the memory device is typically synchronized with the input clock signal, which is generally a fixed frequency clock signal. However, even if the frequency of the input clock signal could be adjusted to a lower frequency, there remains the issue with the limited range of clock frequencies that conventional delay-locked loops can accommodate. As previously discussed, the minimum frequency is often one-half of the maximum operating frequency, which may still be higher than what is desirable under certain conditions. In this situation, to manage power consumption more efficiently, it would be desirable to then operate the memory device at a frequency lower than what is possible with conventional memory devices.

One approach to overcoming the limitation of one-half the maximum operation frequency is to use a delay-locked loop having a variable delay line 102 with a greater range of adjustable delay. Moreover, it is desirable to have a large number of stages in the variable delay line 102 with each stage having an incremental delay to provide better resolution in controlling the value of the variable delay. A consequence of having the desired fine resolution and broad range of variable delay is that it can result in the delay line consisting of a large number of individual delay stages, which will consume a relatively large amount of space on a semiconductor substrate in which the delay-locked loop and other components of the synchronous memory device are formed. Moreover, such a large number of individual delay stages can result in significant power consumption by the delay-locked loop, which may be undesirable particularly in applications where the synchronous memory device is contained in a portable battery-powered device.

SUMMARY OF THE INVENTION

According to one aspect of the invention, a clock signal generator is provided for generating an output clock signal synchronized with an input clock signal having an input clock frequency. The clock signal generator includes an input buffer having an input to which the input clock signal is applied and further having an output at which a buffered clock signal is provided. Further included in the clock signal generator is a variable delay circuit having an input coupled to the output of the input buffer and having an output at which a delayed clock signal is provided. The variable delay circuit has a frequency controlled adjustable delay circuit coupled to the output of the input buffer to provide a first time delay based on the frequency of the buffered clock signal and further has a phase controlled adjustable delay circuit coupled to the output of the input buffer and the output of the variable delay circuit to provide a second time delay based on the phase difference between the buffered clock signal and a feedback clock signal. The feedback clock signal is delayed with respect to the delayed clock signal by a model time delay. An output buffer having an input coupled to the output of the variable delay circuit and an output at which the output clock signal is provided is also included in the clock signal generator.

In another aspect of the invention, a method for generating a clock signal synchronized with an input clock signal propagated through an input buffer and an output buffer is provided. The method includes delaying an input buffered clock signal by a first time delay based on the frequency of the input buffered clock signal, and further delaying the delayed input buffered clock signal by a second time delay to compensate for timing skew introduced by the input buffer, the output buffer and the process of delaying the input buffered clock signal.

DETAILED DESCRIPTION OF THE INVENTION

Embodiments of the present invention are directed to a delay-locked loop including a frequency dependent variable delay line for accommodating a wide range of operating frequencies. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
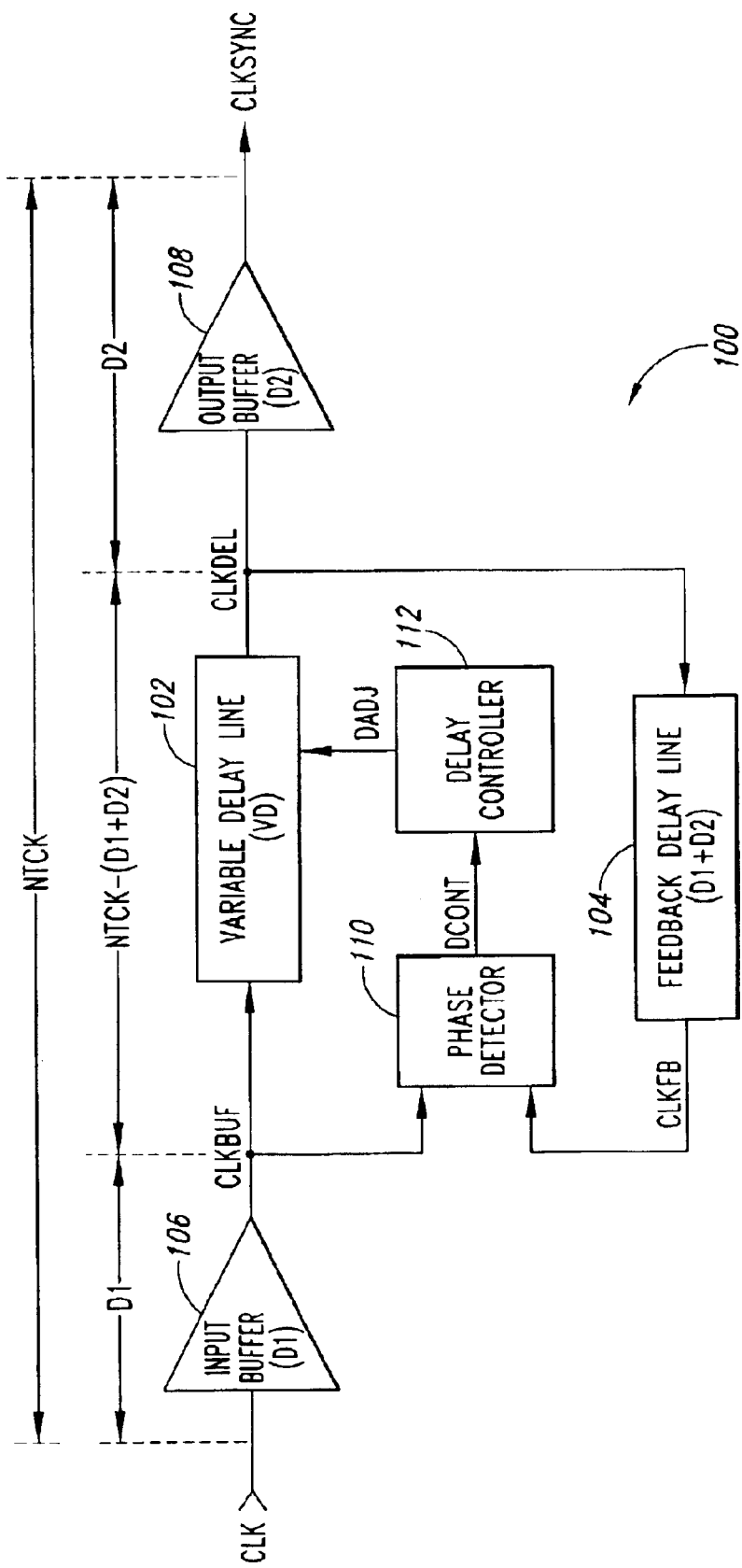
FIG. 1 is a functional block diagram of a conventional delay-locked loop.
Figure 2:
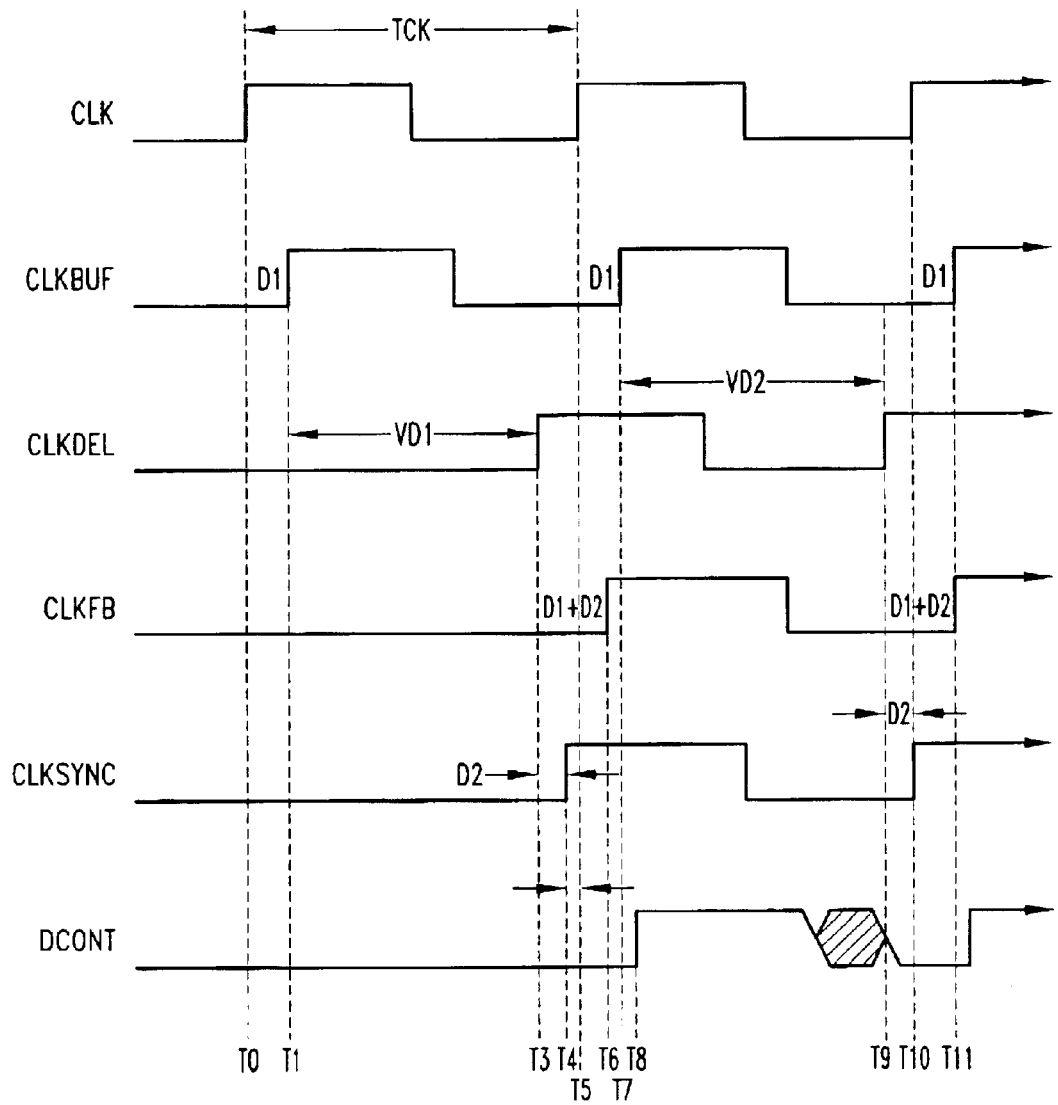
FIG. 2 is a signal timing diagram illustrating various signals generated during operation of the delay-locked loop of FIG. 1.
Figure 3:
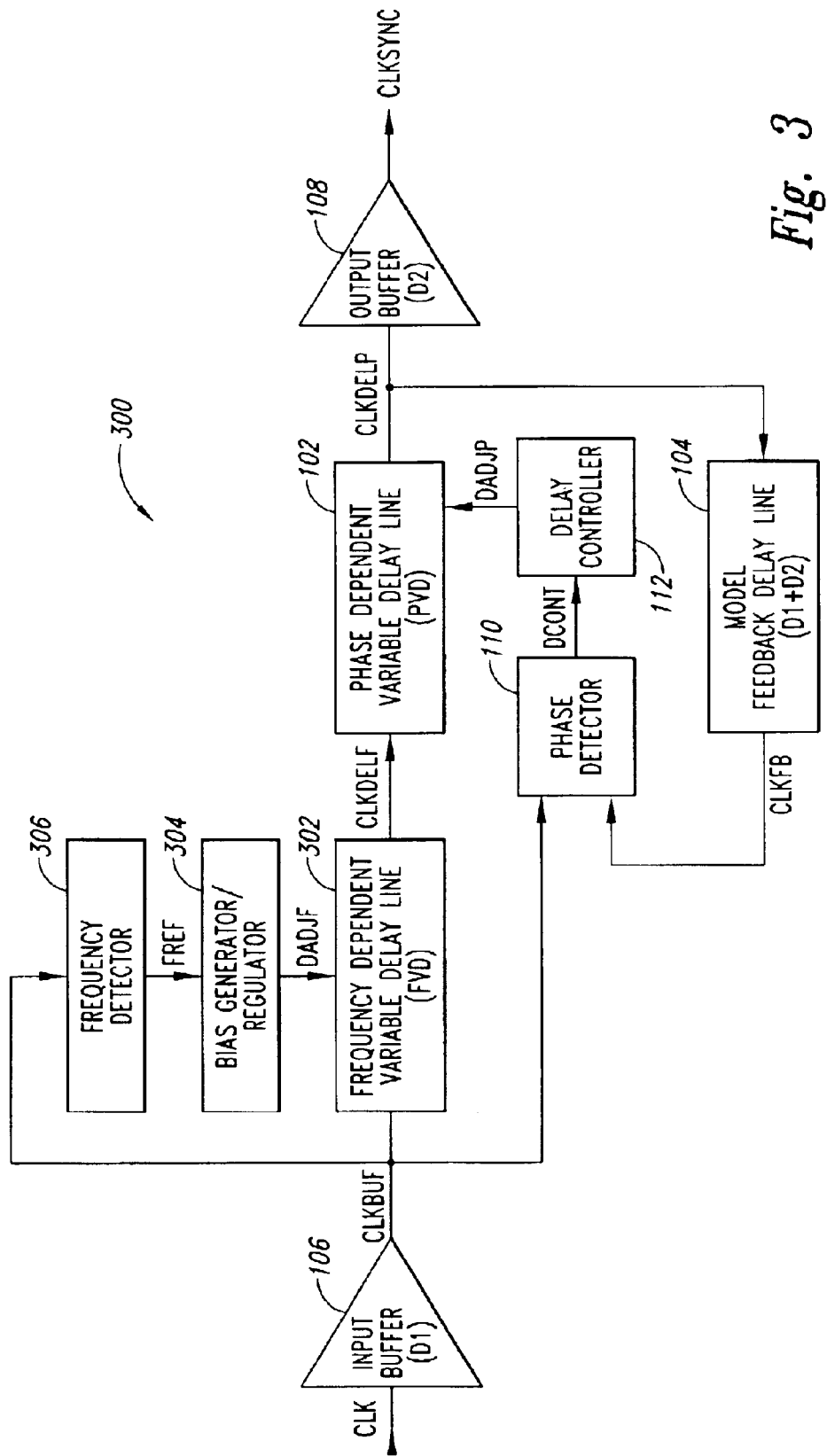
FIG. 3 is a functional block diagram of a delay-locked loop according to an embodiment of the present invention.

FIG. 3 illustrates a delay-locked loop (DLL) 300 according to an embodiment of the present invention. The DLL 300 includes circuits that are similar to those included in the conventional DLL 100 (FIG. 1). Consequently, where appropriate, the same reference numbers will be used in FIG. 3 to refer to the circuits previously described with respect to FIG. 1. The DLL 300 includes the input and output buffers 106, 108, the feedback delay line 104, the phase detector 110, and the delay controller 112, as previously discussed with respect to the conventional DLL 100. As also previously discussed, the input buffer 106 and output buffer 108 represents all components and the associated delay between the input and output of the delay-locked loop 100. For example, the output buffer 108 can represent all of the components of a data path in the memory device through which the data propagates to be provided onto the data bus. The DLL 300 also includes the variable delay line 102 having a variable delay PVD. It will be appreciated by one ordinarily skilled in the art that the variable delay line 102, although to some degree is frequency dependent, can also be considered a phase dependent variable delay line. That is, the variable delay PVD can also be considered as being adjusted according to the phase difference between the CLKBUF and CLKFB signals, as measured by the phase detector 110. However, the variable delay line 102 will be referred to herein as being a phase dependent variable delay line.

The delayed output clock signal CLKDELP of the variable delay line 102 is provided to the input of the output buffer 108. As previously described, the variable delay PVD of the variable delay line 102 is adjusted until the CLKBUF and CLKFB signals are synchronized, or in phase, at which point, the output clock signal CLKSYNC is synchronized with the input clock signal CLK.

The DLL 300 further includes a frequency dependent variable delay line 302 having a variable delay of FVD. The frequency dependent variable delay line 302 receives the CLKBUF signal from the input buffer 106 and provides a delayed output clock signal CLKDELF to the variable delay line 102. The variable delay FVD of the frequency dependent variable delay line 302 is adjusted by a control signal DADJF, that is generated by a bias generator 304 in response to a frequency reference signal FREF. In one embodiment of the present invention, the time delay of the frequency dependent variable delay line 302 is adjusted by providing a DADJF signal as a bias voltage. The voltage value of the DADJF signal controls the delay time provided by the frequency dependent variable delay line 302. The FREF signal is generated by a frequency detector 306 coupled to the output of the input buffer 106 to receive the CLKBUF signal. As will be described in more detail below, the FREF signal is indicative of the frequency of the CLKBUF signal. In general, the frequency dependent variable delay line 302 has a variable delay FVD that is inversely proportional to the frequency of the CLKBUF signal. Since the CLKBUF signal will have the same clock frequency as the input CLK signal, the variable delay FVD is inversely proportional to the input CLK signal as well. Thus, as the frequency of the CLK signal decreases, and the period of the CLK signal correspondingly increases, the variable delay FVD increases as well. As will be discussed in more detail below, the range of time delay to be provided by the frequency dependent variable delay line 302 should be sufficient to provide a total delay time with the model feedback delay line 104 (i.e., (D1+D2)+FVD) to shift the phase of the CLKBUF and CLKFB signals to within the range of adjustment of the phase dependent variable delay 102.

The frequency dependent variable delay line 302, the bias generator/regulator 304, and the frequency detector 306 are conventional, and can be implemented using conventional designs well known in the art.

As will be explained in more detail below, the DLL 300 can be used to synchronize clock signals over a greater range of operating frequencies than conventional DLLs, such as that illustrated and described with respect to FIG. 1. The synchronization provided by the DLL 300 is "dynamic," in that the DLL 300 has the ability to synchronize to an input CLK signal as the frequency of the CLK signal is changed, without the need of being reset. As previously discussed, in conventional DLLs, the range of operating frequencies is typically limited by the range of variable delay PVD of the variable delay line 102. However, as also previously discussed, increasing the range of variable delay PVD by increasing the number of serially connected delay stages in the variable delay line 102 is undesirable for several reasons. The DLL 300, in contrast, can accommodate a wide range of input clock frequencies without the need to increase the number of delay stages of the variable delay line 102. Moreover, the DLL 300 can dynamically synchronize to a variable frequency input CLK signal without being reset, and consequently, is suitable for live frequency scaling.

In operation, the DLL 300 operates in much the same fashion as the DLL 100. However, the frequency detector 306 is used to create a frequency reference signal FREF that is used by the bias generator/regulator 304 to generate a DADJF signal and adjust the variable delay FVD of the frequency dependent variable delay line 302. In a preferred embodiment, the DADJF signal generated by the bias generator/regulator 304 has a voltage value that varies with changes in the frequency of the input CLK signal. In an alternative embodiment, the magnitude of the current of the DADJF signal varies with the frequency of the input CLK signal. It will be appreciated that other characteristics of a DADJF signal can be used to adjust the delay of the frequency dependent variable delay line without departing from the scope of the present invention.

As the frequency of the CLK signal is decreased, and consequently, the period of the CLK signal is extended, the variable delay FVD is adjusted to have a greater delay time in order to dynamically perform a coarse timing adjustment. The closed loop portion of the DLL 300 including the variable delay line 102 is used to make finer timing adjustments to synchronize to the CLK signal. As a result of using the variable delay line 102 to perform the fine timing adjustments, the frequency detector 306, the bias generator/regulator 304, and the frequency dependent variable delay line 302 can be relatively simple in design, and do not need to have a linear relationship between the frequency of the CLK signal and the variable delay time FVD. The frequency dependent variable delay line 302 is not used to provide perfect timing with the CLKBUF signal, but rather, merely coarsely scale the operating range of the DLL 300 to the clock frequency of the CLK signal.

Operation of the DLL 300 will be further explained with reference to FIG. 4. FIG. 4 includes timing diagrams of various clock signals. It will be appreciated that the clock signals shown are not accurate representations of clock signals present during operation of the DLL 300, but have been illustrated in FIG. 4 to aid in explaining the operation of the DLL 300. FIG. 4A illustrates a first input clock signal CLK1 having a first clock frequency. A delayed clock signal CLK1+(D1+D2) is also shown in FIG. 4A having a delay 404 of (D1+D2), shown between times T0 and T1, relative to the CLK1 signal. The delay 404 represents the total delay of the input buffer 106 and the output buffer 108. As previously discussed, the delay (D1+D2) is modeled in the closed loop portion of the DLL 300 by the feedback delay line 104. A second delayed clock signal CLK1+(D1+D2)+FVD is shown to have a delay 408a of FVD1 relative to the CLK1+(D1+D2) clock signal. The delay 408a represents the time delay of the frequency dependent variable delay line 302 adjusted according to the frequency of the CLK1 signal. The delay 408a is shown in FIG. 4A between times T1 and T2. As previously discussed, and will be illustrated by FIG. 4, the delay of the frequency dependent variable delay line 302 is adjusted to accommodate a greater range of operating frequencies compared to conventional DLLs. As shown in FIG. 4, the frequency dependent variable delay line 302 provides a delay that is approximately one-and-a-quarter times the period of the input clock signal. However, it will be appreciated that other relationships between the delay and the input clock frequency can be used without departing from the scope of the present invention. For example, instead of having a linear relationship of one-and-a-quarter times, a different linear relationship can be used, or alternatively, a non-linear relationship between the delay FVD and the frequency of the input clock signal could be used as well.

Figure 4C:
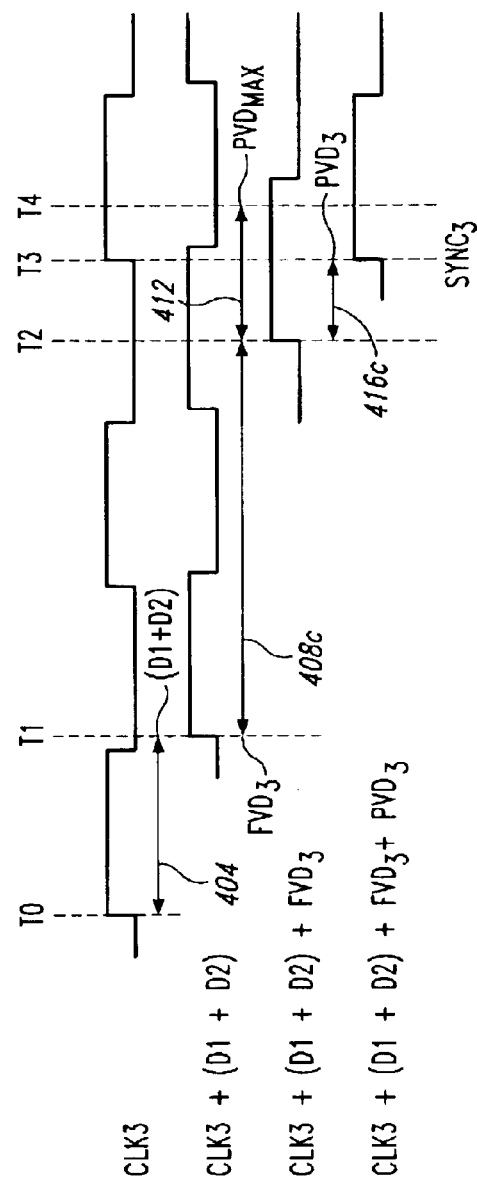
FIG. 4 is a signal timing diagram illustrating various delayed clock signals having timing delays relative to input clock signals of clock frequencies.

FIG. 4A further illustrates a delay 412 that represents the maximum adjustable delay PVDmax of the variable delay line 102. That is, the variable delay line 102 is capable of introducing a time delay to the CLK1+(D1+D2)+FVD1 signal of up to PVDmax, if necessary. As will be shown by the comparison of FIGS. 4A, 4B, and 4C, the total delay introduced by the time delay of the input buffer 106 and the output buffer 108 (represented in the feedback loop as the model feedback delay line 104) and the frequency dependent variable delay line 302 should be sufficient to provide a clock signal having a phase within the maximum adjustable range of the time delay PVDmax in order to generate a CLKSYNC signal synchronized with the input CLK signal. As shown in FIG. 4A, only a delay 416a, shown between times T2 and T3, is required to synchronize with the input CLK1 signal.

FIG. 4B is a timing diagram of various clock signals delayed with respect to a second input clock signal CLK2, that has a frequency approximately one-half of the frequency of the CLK1 signal shown in FIG. 4A. A delayed clock signal CLK2+(D1+D2) is shown in FIG. 4B having a delay 404 of (D1+D2), shown between times T0 and T1. It will be appreciated that the delay 404 of FIG. 4B is the same time delay as that shown in FIG. 4A since the total delay introduced by the input buffer 106 and the output buffer 108 (i.e., D1+D2) is independent of the frequency of the input clock signal. However, as previously mentioned, the delay introduced by the frequency dependent variable delay line 302 is dependent on the frequency of the input clock signal. As shown in FIG. 4B, the frequency dependent variable delay line 302 provides a delay 408b of FVD2, shown between times T1 and T2. In comparing the delay 408a of FIG. 4A and the delay 408b of FIG. 4B, it is apparent that the delay 408b is considerably greater than the delay 408a. The frequency dependent variable delay 302 adjusts its delay to the delay 408b without the need to reset the DLL 300, thus, providing dynamic frequency scaling.

Also shown in FIG. 4B is a delay 412 representing the maximum adjustable time delay PVDmax provided by the variable delay line 102, shown between times T2 and T4. As with the delay 404 (i.e., the total delay of the input buffer 106 and the output buffer 108, (D1+D2)), the delay 412 is the same regardless of the frequency of the input clock signal. That is, although the delay 412 may be adjustable, the amount of delay provided by the variable delay line 102 is independent of the frequency of the input clock signal, unlike the delay 408b provided by the frequency dependent variable delay line 302. More specifically, the delay of the variable delay line 102 is dependent on the phase difference between two clock signals. As shown in FIG. 4B, only a delay 416b of PVD2, shown between times T2 and T3, is needed to synchronize to the input CLK2 signal.

FIG. 4C is a timing diagram showing various clock signals delayed with respect to an input clock signal CLK3 having a clock frequency that is approximately four times the frequency of the CLK1 signal shown in FIG. 4A. A delayed clock signal CLK3+(D1+D2) is shown to be delayed from the CLK3 signal by a delay 404 of (D1+D2), shown between times T0 and T1. As previously discussed, the delay 404 represents the total delay of the input buffer 106 and the output buffer 108, which is constant and does not change with frequency. A delay 408c of FVD3, shown between times T1 and T3, is provided by the frequency dependent variable delay line 302. In comparing the length of the delay 408c with the delay 408a of FIG. 4A, and the delay 408b of FIG. 4B, it is apparent that the delay provided by the frequency dependent variable delay line 302 is adjusted according to the frequency of the input clock signal. Adjustment of the frequency dependent variable delay line 302 to have the delay 408c is performed dynamically, avoiding the need to reset the DLL 300 to accommodate the lower frequency of the CLK3 signal. FIG. 4C further shows a delay 412 representing the maximum adjustable delay PVDmax of the variable delay line 102, shown between times T2 and T4. As previously discussed, the delay of the variable delay line 102 is adjusted according to the phase difference between the CLKBUF and CLKFB signals (FIG. 3), and not according to the frequency of the input clock signal. To provide a clock signal synchronized with the CLK3 signal, the variable delay line 102 is adjusted to have a delay 416c of time PVD3, shown between times T2 and T3.

As illustrated by FIG. 4, the frequency dependent variable delay line 302 provides a variable time delay FVD that is dependent on the frequency of the input clock signal. As previously discussed, the frequency dependent variable delay line 302 enables the DLL 300 to accommodate a broader range of operating frequencies by providing a coarse delay adjustment sufficient to allow the variable delay line 102 to provide fine delay adjustments in order to generate an output signal synchronized with an input clock signal. It will be appreciated by those of ordinary skill in the art that the timing diagrams of FIG. 4 have been provided by way of example, and that the particular details previously discussed with respect to FIG. 4, such as input clock frequencies, time delays, timing relationships, and the like, are not intended to limit the scope of the present invention to any particular embodiment. Moreover, it will be appreciated that embodiments of the present invention can be implemented using conventional designs well known in the art, and that the description provided herein is sufficient to enable those ordinarily skilled in the art to practice the invention.

Figure 5:
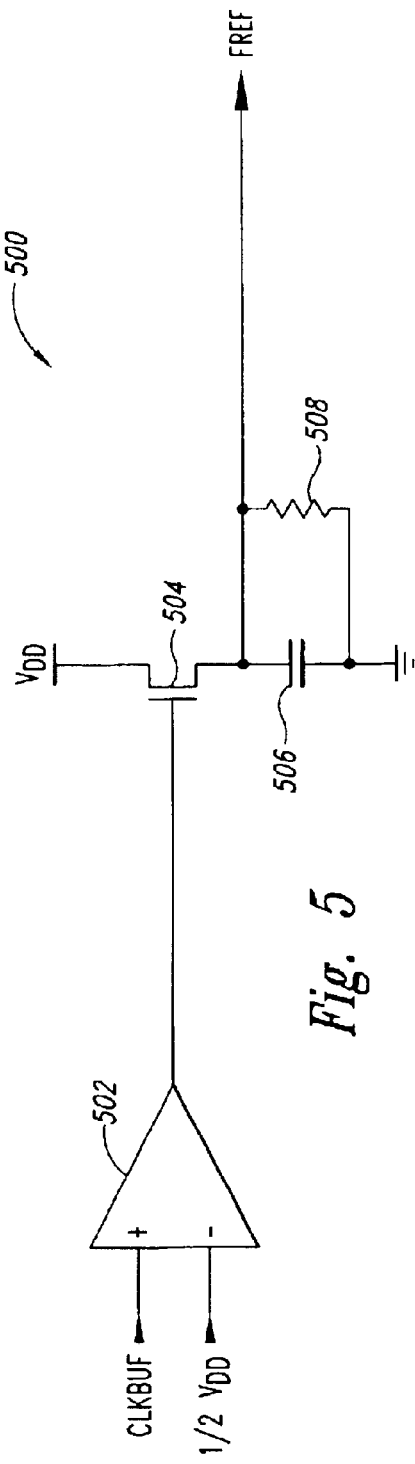
FIG. 5 is a functional block diagram of a frequency detector that can be substituted into a delay-locked loop according to an embodiment of the present invention.

FIG. 5 illustrates a frequency detector 500 according to an embodiment of the present invention. The frequency detector 500 can be substituted for the frequency detector 306 shown in FIG. 3. The frequency detector 500 includes a differential amplifier 502 having a first input coupled to receive the CLKBUF signal and a second input coupled to receive a reference voltage signal. As shown in FIG. 5, the voltage level of the reference voltage signal is one-half Vdd, where Vdd represents a device supply voltage level. An output of the differential amplifier 502 is coupled to the gate of a transistor 504. The transistor 504 couples the supply voltage Vdd to a capacitor 506 and a resistor 508, which are coupled in parallel between the transistor 504 and ground. The FREF signal generated by the frequency detector 306 will have voltage level that is indicative of the frequency of the CLKBUF signal. That is, as the frequency of the CLKBUF signal decreases, the transistor 504 will remain conductive for a longer time relative to a higher frequency clock signal. As a result, the capacitor 506 will be charged to a higher voltage level during this time. It will be appreciated that where the frequency detector does not need to have a fast dynamic response, for example, where the frequency of the input clock signal changes at about 0.5 MHz/$\mu$s, the RC time constant of the capacitor 506 and resistor 508 can be large to provide a highly filtered FREF signal.

Figure 6:
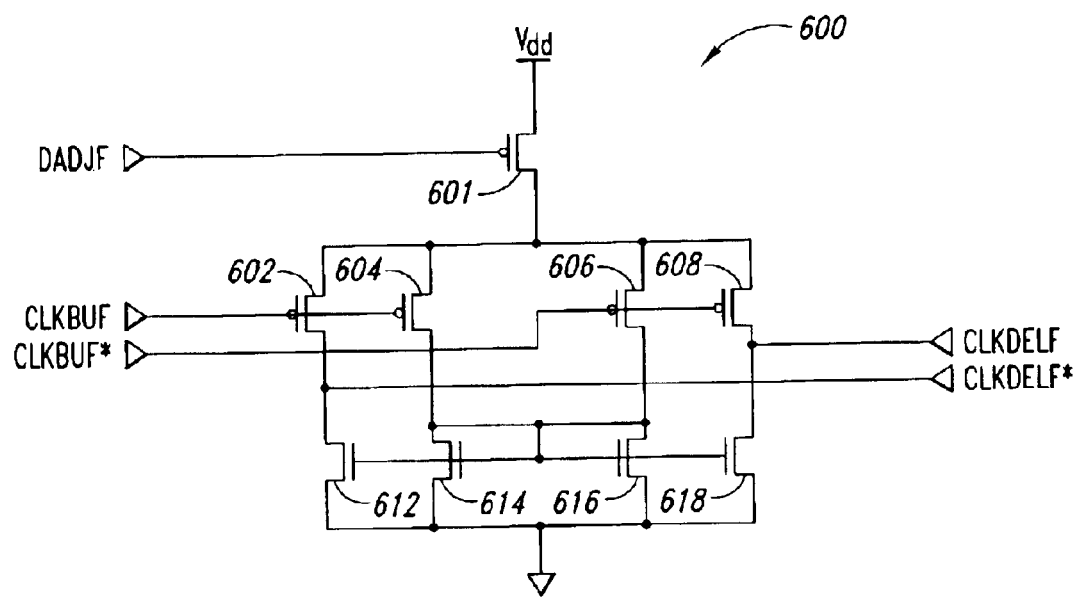
FIG. 6 is a functional block diagram of a bias-controlled delay element that can be substituted into a delay-locked loop according to an embodiment of the present invention.

FIG. 6 illustrates a bias-controlled delay element 600 according to an embodiment of the present invention. The bias-controlled delay element 600 can be included in the frequency dependent variable delay line 302 of FIG. 3. The bias-controlled delay element 600 is a differential delay element, providing good duty cycle response. Complementary clock signals, CLKBUF and CLKBUF* are provided to transistors 602, 604 and 606, 608, respectively. Circuitry for generating synchronous complementary clock signals are well known in the art, and will not be discussed in detail herein. As the pairs of transistors 602, 604 and 606, 608 are alternatively activated, the complementary output clock signals CLKDELF and CLKDELF* are generated. The transistors 612, 614, 616, 618 are used for setting a bias voltage on the pairs of transistors 602, 604 and 606, 608. As previously discussed, in one embodiment the DADJF signal generated by the bias generator/regulator 304 (FIG. 3) has a voltage level that varies with the frequency of the input CLK signal. The DADJF signal is applied to a transistor 601, through which a voltage supply Vdd is coupled to the alternately activated pairs of transistors 602, 604 and 606, 608. The conductivity of the transistor 601 is controlled by the voltage of the DADJF signal, and consequently, as the conductivity of the transistor 601 is adjusted, the voltage level coupled through the pairs of transistors 602, 604 and 606, 608 to the output terminals at which CLKDELF and CLKDELF* signals are provided is adjusted as well. This results in altering the speed at which the CLKDELF and CLKDELF* clock signals transition from one clock state to the other, which in turn, adjusts the propagation delay of the CLKBUF and CLKBUF* signals through the bias-controlled delay element 600 to be provided as the CLKDELF and CLKDELF* signals. Thus, as the voltage of the DADJF signal is changed, the delay time of the bias-controlled delay element is changed as well.

Figure 7A:
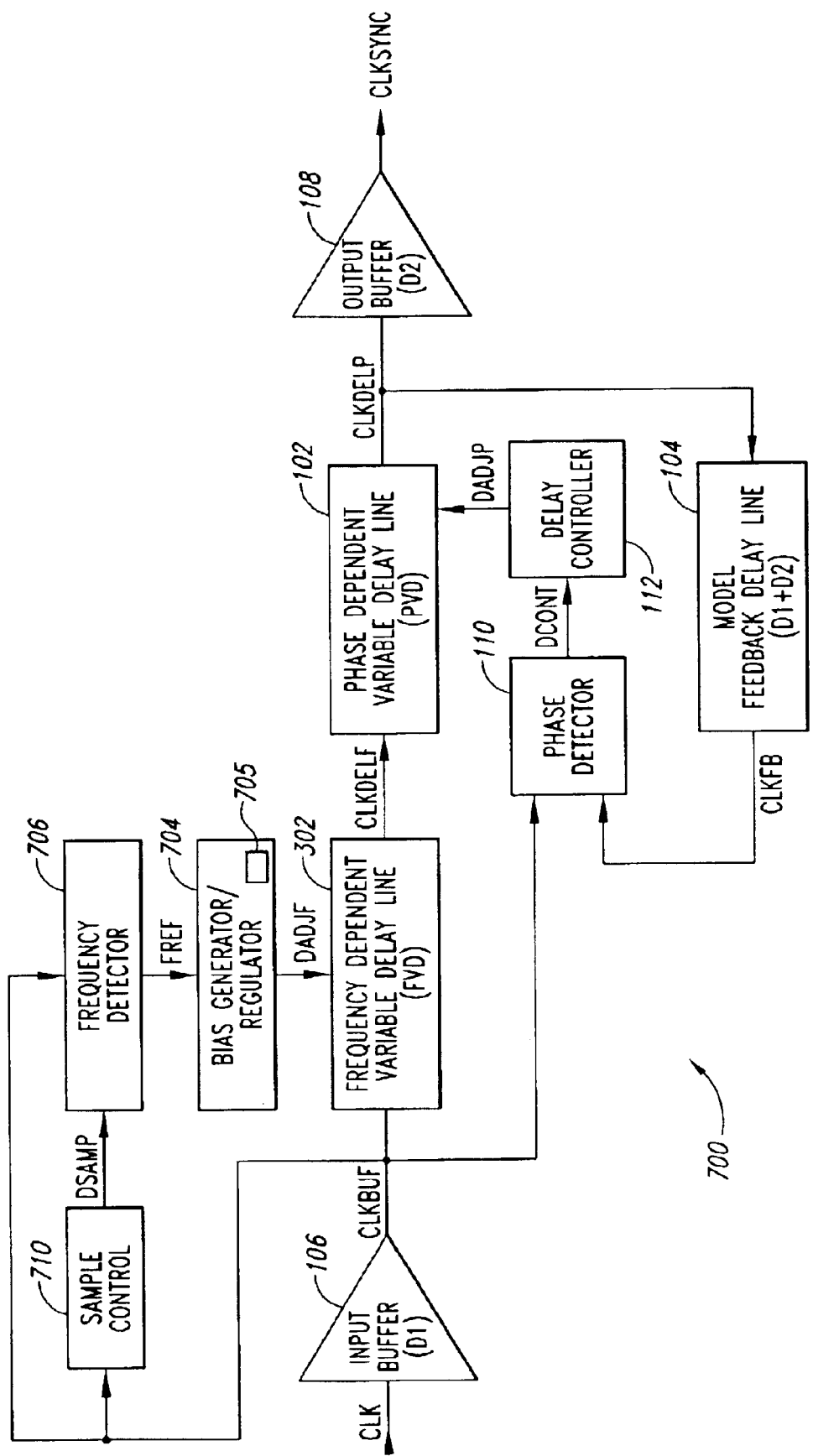
FIGS. 7A and 7B are functional block diagrams of delay-locked loops according to alternative embodiments of the present invention.

FIG. 7A illustrates a DLL 700 according to an alternative embodiment of the present invention. Common reference numbers have been used for functional blocks already described. The DLL 700 is similar to the DLL 300 of FIG. 3. However, the DLL 700 further includes a sample control 710 having an input coupled to the output of the input buffer circuit 106 to receive the CLKBUF signal. The sample control 706 is further coupled to a frequency detector 706 to provide a sample control signal DSAMP. The sample control 710 triggers the frequency detector 706 to periodically sample the frequency of the CLKBUF signal, rather than have the frequency of the CLKBUF signal monitored continuously. The sample control 710 can be implemented with conventional circuitry well known to those ordinarily skilled in the art. For example, in one embodiment of the present invention, the sample control 710 includes a frequency divider having an output that is used as the DSAMP signal to cause the frequency detector 706 to sample the frequency of the CLKBUF signal according to the reduced frequency. Alternatively, the sample control 710 includes a counter circuit that outputs a DSAMP signal in response to counting a programmed number of clock cycles of the CLKBUF signal. It will be appreciated that alternative implementations can be made using other well known circuits, and that use of such alternative circuits remain within the scope of the present invention.

As with the previously discussed embodiments, the frequency detector 706 generates a reference signal FREF representative of the frequency of the CLKBUF signal, and provides it to a bias generator/regulator 704. In the DLL 700, the bias generator/regulator 704 includes circuitry 705 to capture the state of the FREF signal. For example, in one embodiment, the bias generator/regulator 704 includes a current latch to capture the magnitude of current of the FREF signal. In an alternative embodiment, the bias generator/regulator 704 includes an analog-to-digital converter for converting the voltage or current of the FREF signal into a digital word that can be stored in a register, also included in the bias generator/regulator 704. Other embodiments of the present invention include alternative circuitry to capture the state of the FREF signal. Such circuitry is well known in the art, and will not be specifically discussed herein in the interest of brevity. However, it will be appreciated by those ordinarily skilled in the art that such modifications can be made without departing from the scope of the present invention. As previously described with respect to the DLL 300, the bias generator/regulator 704 generates a control signal DADJF in response to the FREF signal and provides it to the frequency dependent variable delay line 302 to adjust the variable delay FVD.

Operation of the DLL 700 is the same as described with respect to the DLL 300, except that a value representing the frequency of the CLKBUF signal, and consequently, the frequency of the input CLK signal, can be captured by the bias generator/regulator 704. The DLL 700 can be used in devices having clock suspend modes, or power-down modes, where the input CLK signal is suspended for the purpose of reducing power consumption. Rather than allowing the reference clock frequency to be lost when the input CLK signal is suspended, resulting in the reference value being incorrect when the device exits the power-down mode, a value representative of the clock frequency can be captured and stored. When the device exits the power-down mode, the value can be retrieved and used to generate a DADJF signal having a previous bias value that was applied to the frequency dependent variable delay line 302 prior to entering the power-down mode. As a result, the time required to reacquire synchronization after exiting a power-down mode can be reduced. It will be appreciated by those ordinarily skilled in the art that analog-to digital and digital-to-analog conversions that are performed in capturing the value representative of the input clock frequency do not need to be accurate. However, the conversions should be consistent. Moreover, as previously discussed, the DLL 700 provides for the frequency detector 706 to periodically sample the frequency of the CLKBUF signal, rather than for the frequency to be continuously monitored. This feature provides the benefit of reducing the inherent power required to operate the frequency detection circuitry.

Figure 7B:
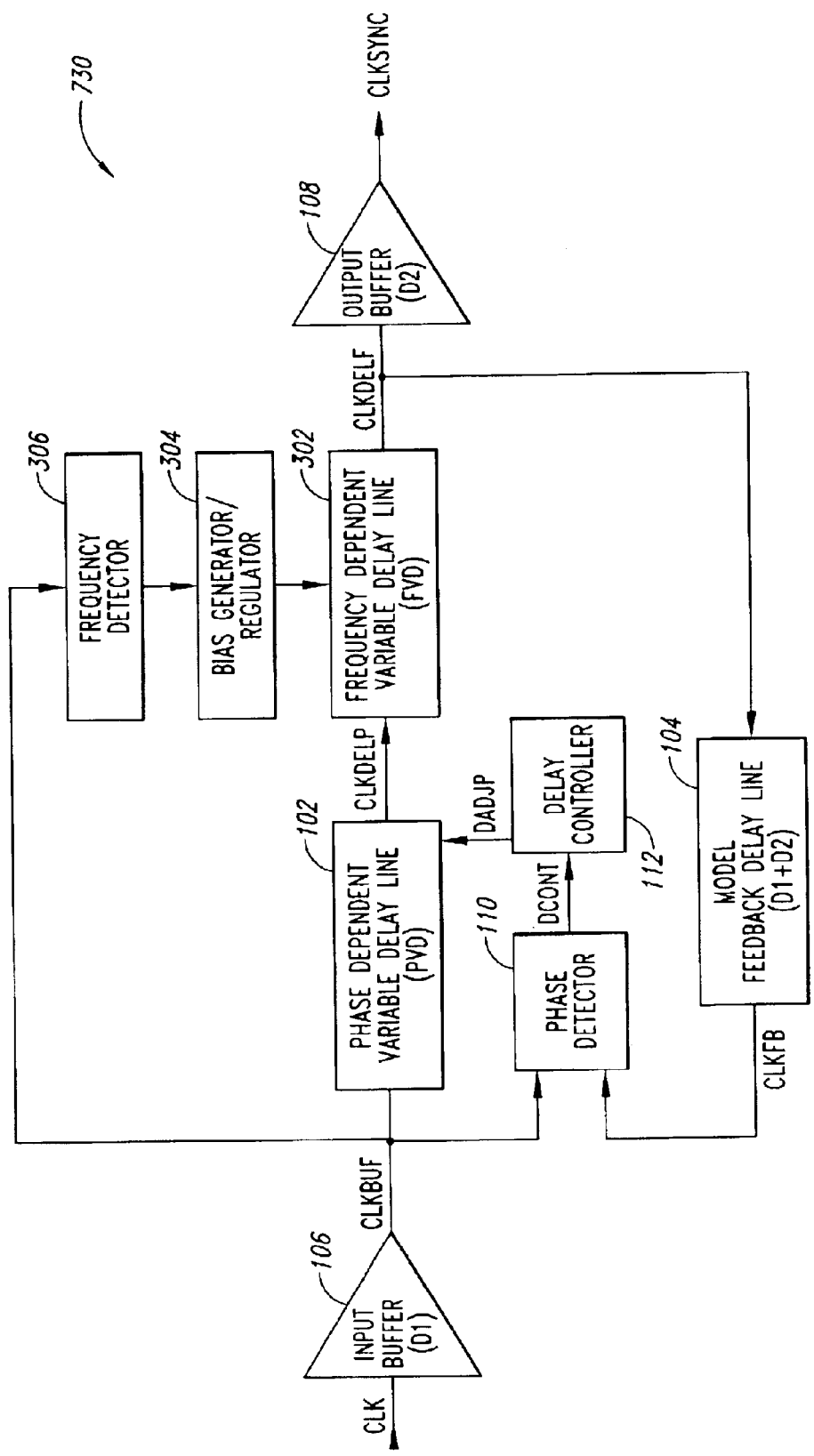

FIG. 7B illustrates a DLL 730 according to an alternative embodiment of the present invention. Common reference numbers have been used for functional blocks already described. The DLL 730 is similar to the DLL 300 of FIG. 3. However, the DLL 730 reverses the order of the phase dependent variable delay line 102 and the frequency dependent variable delay line 302. Operation of the DLL 730 is the same as described with respect to the DLL 300. It will be appreciated that modifications such as those illustrated in FIG. 7B are well within the understanding those ordinarily skilled in the art, and that such modifications are well within the scope of the present invention.

Figure 8:
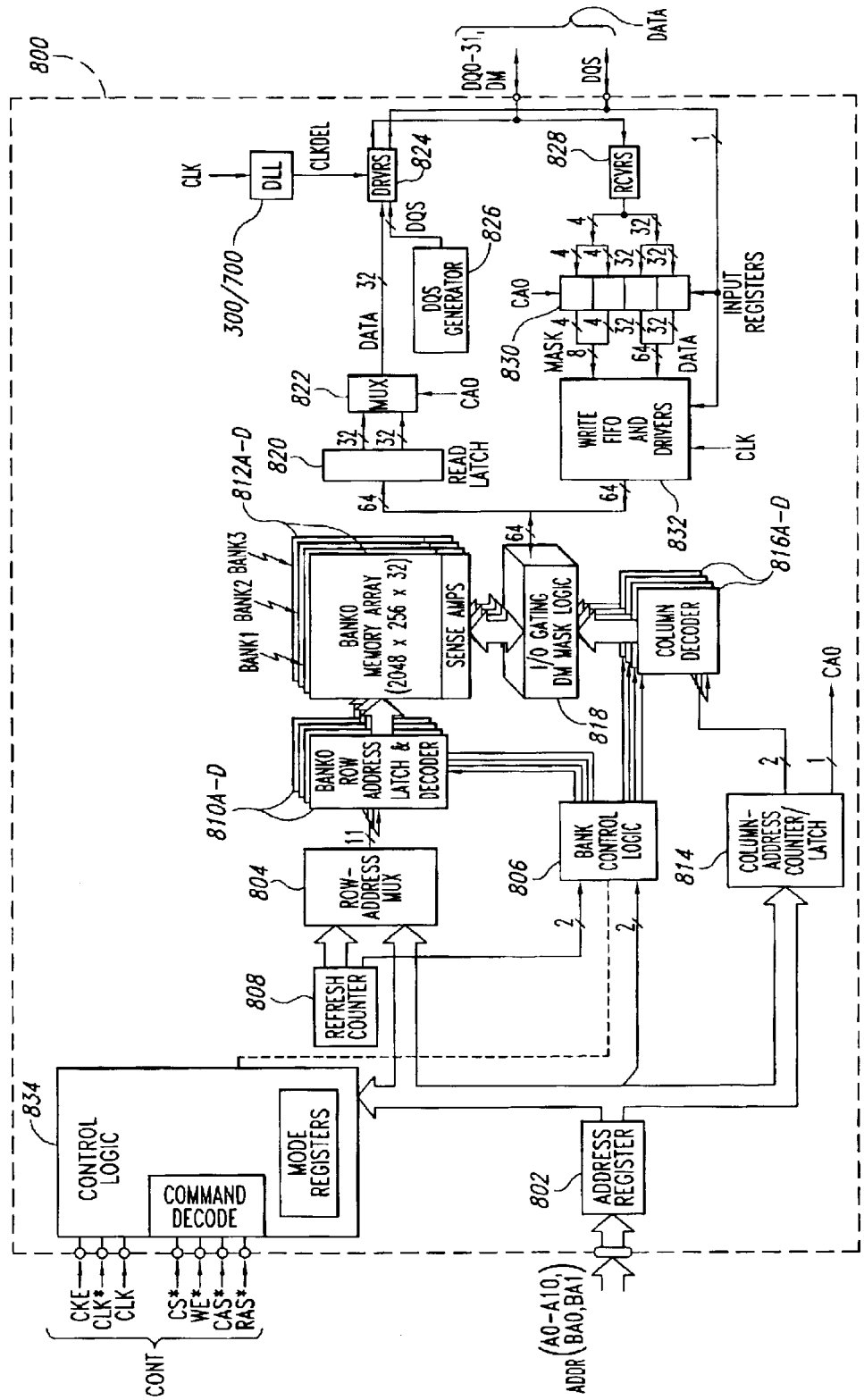
FIG. 8 is a functional block diagram illustrating a synchronous memory device including the delay-locked loop of FIG. 3 and/or the delay-locked loops of FIG. 7.

FIG. 8 is a functional block diagram of a memory device 800 including the delay-locked loop 300 of FIG. 3 and/or the delay-locked loops 700, 730 of FIG. 7. The memory device 800 in FIG. 8 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. In response to the decoded row address, the activated row address latch and decoder 810A–D applies various signals to a corresponding memory bank 812A–D to thereby activate a row of memory cells corresponding to the decoded row address. Each memory bank 812A–D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802. In response to the column address from the counter and latch 814, the activated column decoder 816A–D applies decode and control signals to an I/O gating and data masking circuit 818 which, in turn, accesses memory cells corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from the delay-locked loop 300/700/730. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL is a delayed version of the CLK signal, and the delay-locked loop 300/700/730 adjusts the delay of the CLKDEL signal relative to the CLK signal to ensure that the DQS signal and the DQ words are placed on the DATA bus in synchronism with the CLK signal, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 828 receives each DQ word and the associated DM signals, and applies these signals to input registers 830 that are clocked by the DQS signal. In response to a rising edge of the DQS signal, the input registers 830 latch a first N/2 bit DQ word and the associated DM signals, and in response to a falling edge of the DQS signal the input registers latch the second N/2 bit DQ word and associated DM signals. The input register 830 provides the two latched N/2 bit DQ words as an N-bit word to a write FIFO and driver 832, which clocks the applied DQ word and DM signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 9:
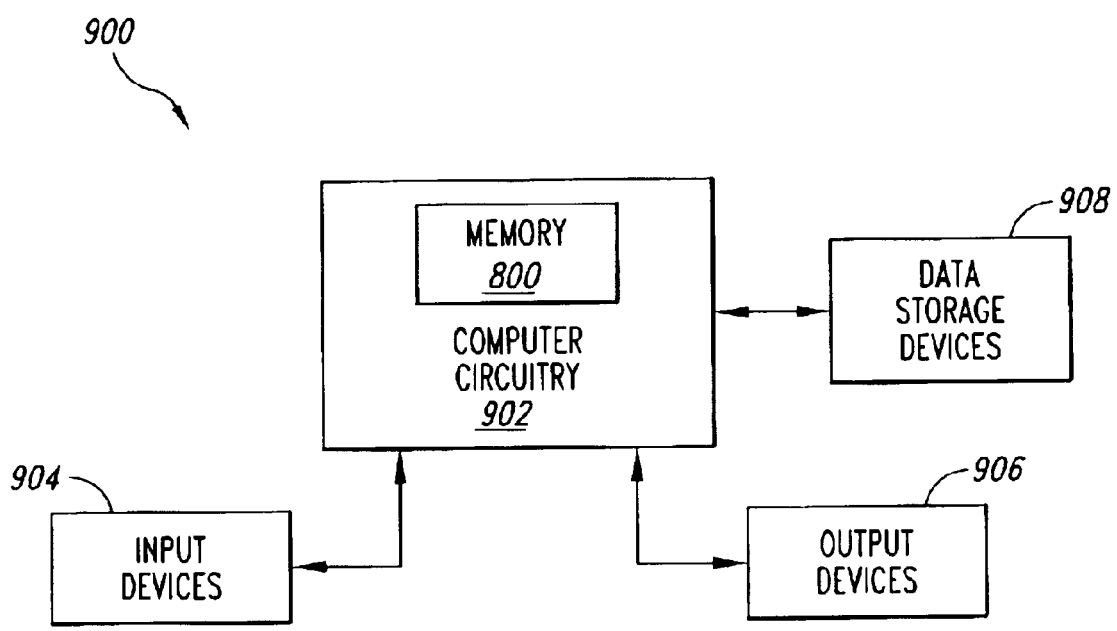
FIG. 9 is a functional block diagram illustrating a computer system including a synchronous memory device of FIG. 8.

FIG. 9 is a block diagram of a computer system 900 including computer circuitry 902 including the memory device 800 of FIG. 8. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, the frequency dependent variable delay line has been described herein as being a separate functional block. However, it will be appreciated that the frequency dependent variable delay line can be incorporated with another one of the functional blocks previously described, such as being incorporated with the phase dependent variable delay line. Moreover, the arrangement of the frequency dependent variable delay line relative to the phase dependent variable delay line can be changed without departing from the scope of the present invention. For example, the output of the phase dependent variable delay line can be input to the frequency dependent variable delay line, which provides a clock signal to the output buffer. Such modifications are well within the skill of those ordinarily skilled in the art. Accordingly, the invention is not limited except as by the appended claims.

What is claimed is:

1. A clock signal generator for generating an output clock signal synchronized with an input clock signal having an input clock frequency, comprising:

an input delay having an input to which the input clock signal is applied and further having an output at which a buffered clock signal is provided;

a variable delay circuit having an input coupled to the output of the input delay and having an output at which a delayed clock signal is provided, the variable delay circuit further having a frequency controlled adjustable delay circuit to provide a first time delay based on the frequency of the buffered clock signal and further having a phase controlled adjustable delay circuit to provide a second time delay based on the phase difference between the buffered clock signal and a feedback clock signal, the feedback clock signal delayed with respect to the delayed clock signal by a model time delay, the frequency controlled adjustable delay circuit including a frequency detector having an input coupled to the output of the input delay and having an output at which a frequency reference signal is provided, the frequency detector generating the frequency reference signal indicative of the input clock frequency;

a bias generator having an input coupled to the output of the frequency detector to generate a control signal having a voltage level based on the frequency reference signal, the control signal provided at an output of the bias generator; and an adjustable delay circuit having a control terminal coupled to the output of the bias generator, the adjustable delay circuit adjusting a time delay according to the voltage level of the control signal to be provided as the first time delay; and an output delay having an input coupled to the output of the variable delay circuit and an output at which the output clock signal is provided.

2. The clock signal generator of claim 1 wherein the frequency reference signal comprises a current signal having a current magnitude based on the frequency of the input clock signal and the bias generator comprises:

a current latch to latch the current magnitude of the frequency reference signal; and a conversion circuit coupled to the current latch to generate a control signal having a voltage level based on the latched current magnitude.

3. The clock signal generator of claim 1 wherein the frequency reference signal comprises an analog signal indicative of the input clock frequency and the bias generator comprises:

an analog-to-digital converter to convert the frequency reference signal into a digital value;

a register coupled to the analog-to-digital converter to store the digital value; and a digital-to-analog converter coupled to the register to convert the digital value into a control signal having a voltage level based on the stored digital value.

4. The clock signal generator of claim 1 wherein the model time delay comprises:
  a first model time delay circuit having a time delay equal to a time delay of the input delay, and
  a second model time delay having a time delay equal to a time delay of the output delay.

5. The clock signal generator of claim 1 wherein the variable delay comprises the frequency controlled adjustable delay circuit coupled to the output of the input delay, and the phase controlled adjustable delay circuit coupled to the frequency controlled adjustable delay to receive the buffered clock signal delayed by the first time delay and provide an output clock signal delayed by the first and second time delay to the input of the output delay.

6. The clock signal generator of claim 1 wherein the variable delay comprises the phase controlled adjustable delay circuit coupled to the output of the input delay, and the frequency controlled adjustable delay circuit coupled to the phase controlled adjustable delay to receive the buffered clock signal delayed by the second time delay and provide an output clock signal delayed by the first and second time delay to the input of the output delay.

7. The clock signal generator of claim 1 wherein the output delay comprises a delay equal to a propagation delay of a data path through which data is provided to a data bus coupled to the output of the data path.

8. A clock signal generator for generating an output clock signal synchronized with an input clock signal having an input clock frequency, the delay-locked loop comprising:
  a frequency dependent variable delay circuit having an input at which a buffered clock signal is applied and having an output at which a first delayed clock signal is provided, the buffered clock signal having a frequency equal to the input clock frequency and skewed with respect to the input clock signal by a first phase difference, the first delayed clock signal delayed with respect to the buffered clock signal by a time delay based on the frequency of the buffered clock signal; and
  a phase dependent variable delay circuit having a first input coupled to the output of the frequency dependent variable delay and having an output at which a pre-skewed clock signal is provided, the pre-skewed clock signal delayed with respect to the first delayed clock signal by a time delay based on the phase difference between the buffered clock signal and a delayed version of the pre-skewed clock signal further delayed by a model time delay having an input delay portion and an output delay portion, the pre-skewed clock signal leading the output clock signal by the time delay of the output delay portion.

9. The clock signal generator of claim 8 wherein the frequency dependent variable delay circuit comprises:
  a frequency detector having an input at which the buffered clock is coupled and having an output at which a frequency reference signal is provided, the frequency reference signal generated by the frequency detector indicative of the input clock frequency;
  a bias generator having an input coupled to the output of the frequency detector to generate a control signal having a voltage level based on the frequency reference signal, the control signal provided at an output of the bias generator; and
  a variable delay circuit having a control terminal coupled to the output of the bias generator, the variable delay circuit adjusting a time delay according to the voltage level of the control signal to be the time delay of the frequency dependent variable delay.

10. The clock signal generator of claim 9 wherein the frequency reference signal comprises a current signal having a current magnitude based on the frequency of the input clock signal and the bias generator comprises:
  a current latch to latch the current magnitude of the frequency reference signal; and
  a conversion circuit coupled to the current latch to generate a control signal having a voltage level based on the latched current magnitude.

11. The clock signal generator of claim 9 wherein the frequency reference signal comprises an analog signal indicative of the input clock frequency and the bias generator comprises:
  an analog-to-digital converter to convert the frequency reference signal into a digital value;
  a register coupled to the analog-to-digital converter to store the digital value; and
  a digital-to-analog converter coupled to the register to convert the digital value into a control signal having a voltage level based on the stored digital value.

12. The clock signal generator of claim 8 wherein the frequency dependent variable delay circuit comprises:
  a frequency detector coupled to receive the buffered clock signal and having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;
  a sample control circuit for generating a sample control signal to cause the frequency detector to sample the frequency of the buffered clock signal;
  a storage circuit for storing the characteristic of the frequency reference signal;
  a bias generator having an input coupled to the storage circuit to generate a control signal having a voltage level based on the stored characteristic; and
  a variable delay circuit having a control terminal coupled to the bias generator, the variable delay adjusting a time delay according to the voltage level of the control signal to the time delay of the frequency dependent variable delay circuit.

13. The clock signal generator of claim 12 wherein the sample control circuit comprises a counter circuit coupled to receive the buffered clock signal to count a number of clock cycles and generate the sample control signal causing the frequency detector to sample the frequency of the buffered clock signal in response to counting a threshold number of clock cycles.

14. The clock signal generator of claim 12 wherein the sample control circuit comprises a frequency divider circuit coupled to receive the buffered clock signal to generate a frequency divided clock signal applied to the frequency detector as the sample control signal causing the frequency detector to sample the frequency of the buffered clock signal.

15. A delay-locked loop for generating an output clock signal synchronized with an input clock signal, comprising:
  an input delay having an input at which the input clock signal is applied and an output at which a first skewed clock signal is provided;
  an output delay having an input at which a pre-skewed clock signal is applied and an output at which the output clock signal is provided; and a variable delay circuit having an input coupled to the output of the input delay and an output coupled to the input of the output delay to provide the pre-skewed clock signal, the variable delay circuit having a frequency dependent variable delay portion providing a time delay based on the frequency of the first skewed clock signal and further having a phase dependent variable delay portion for providing a time delay to compensate for timing skew introduced by the input delay, the frequency dependent variable delay portion, and the output delay, the frequency dependent variable delay portion including
a frequency detector having an input coupled to the output of the input delay and having an output at which a frequency reference signal is provided, the frequency reference signal generated by the frequency detector indicative of an input clock frequency;
a bias generator having an input coupled to the output of the frequency detector to generate a control signal having a voltage level based on the frequency reference signal, the control signal provided at an output of the bias generator; and
an adjustable delay circuit having a control terminal coupled to the output of the bias generator, the adjustable delay circuit adjusting a time delay according to the voltage level of the control signal to be the time delay of the frequency dependent variable delay portion.

16. The delay-locked loop of claim 15 wherein the frequency reference signal comprises a current signal having a current magnitude based on the frequency of the input clock signal and the bias generator comprises:
a current latch to latch the current magnitude of the frequency reference signal; and
a conversion circuit coupled to the current latch to generate a control signal having a voltage level based on the latched current magnitude.

17. The delay-locked loop of claim 15 wherein the frequency reference signal comprises an analog signal indicative of the input clock frequency and the bias generator comprises:
an analog-to-digital converter to convert the frequency reference signal into a digital value;
a register coupled to the analog-to-digital converter to store the digital value; and
a digital-to-analog converter coupled to the register to convert the digital value into a control signal having a voltage level based on the stored digital value.

18. The delay-locked loop of claim 15 wherein the variable delay circuit comprises the frequency dependent variable delay portion coupled to the output of the input delay, and the phase controlled adjustable delay circuit coupled to the frequency dependent variable delay portion to receive the first skewed clock signal delayed by the frequency dependent variable delay portion and provide the pre-skewed clock signal to the output delay.

19. The delay-locked loop of claim 15 wherein the variable delay comprises the phase dependent variable delay portion coupled to the output of the input delay, and the frequency dependent variable delay portion coupled to the phase dependent variable delay portion to receive the first skewed clock signal delayed by the phase dependent variable delay portion and provide the pre-skewed clock signal to the output delay.

20. The delay-locked loop of claim 15 wherein the output delay comprises a delay equal to a propagation delay of a data path through which data is provided to a data bus coupled to the output of the data path.

21. A delay-locked loop for providing an output clock signal synchronized with an input clock signal having an input clock frequency, the delay-locked loop comprising:
an input delay having an input at which the input clock signal is applied and having an output at which a buffered clock signal is provided;
a variable delay line having an input coupled to the output of the input delay and having an output at which a delayed clock signal is provided, the variable delay line further having a first adjustable delay portion to provide a first time delay based on a first control signal and a second adjustable delay portion to provide a second time delay based on a second control signal;
an output delay having an input coupled to the output of the variable delay line and having an output at which the output clock signal is provided;
a frequency detector having an input coupled to the output of the input delay and an output coupled to the first adjustable delay portion of the variable delay line to provide a frequency reference signal indicative of the input clock frequency as the first control signal;
a model delay having an input coupled to the output of the variable delay line and an output at which a feedback clock signal is provided; and
a phase detector having a first input coupled to the output of the input delay and a second input coupled to the output of the model delay, the phase detector generating a reference phase signal indicative of the phase difference between the feedback clock signal and the buffered clock signal to be provided to the second adjustable delay portion of the variable delay line as the second control signal.

22. The delay-locked loop of claim 21 wherein the first adjustable delay portion of the variable delay line comprises:
a frequency detector having an input coupled to the output of the input delay and having an output at which a frequency reference signal is provided, the frequency detector generating the frequency reference signal indicative of the input clock frequency;
a bias generator having an input coupled to the output of the frequency detector to generate a control signal having a voltage level based on the frequency reference signal, the control signal provided at an output of the bias generator; and
a variable delay circuit having a control terminal coupled to the output of the bias generator, the variable delay adjusting a time delay according to the voltage level of the control signal to be the first time delay.

23. The delay-locked loop of claim 22 wherein the frequency reference signal comprises a current signal having a current magnitude based on the frequency of the input clock signal and the bias generator comprises:
a current latch to latch the current magnitude of the frequency reference signal; and
a conversion circuit coupled to the current latch to generate a control signal having a voltage level based on the latched current magnitude.

24. The delay-locked loop of claim 22 wherein the frequency reference signal comprises an analog signal indicative of the input block frequency and the bias generator comprises:
an analog-to-digital converter to convert the frequency reference signal into a digital value;

a register coupled to the analog-to-digital converter to store the digital value; and a digital-to-analog converter coupled to the register to convert the digital value into a control signal having a voltage level based on the stored digital value.

25. The delay-locked loop of claim 21 wherein the first adjustable delay portion of the variable delay line comprises:

a frequency detector having an input coupled to the output of the input delay, having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;

a sample control circuit for generating a sample control signal to cause the frequency detector to sample the frequency of the buffered clock signal;

a storage circuit for storing the characteristic of the frequency reference signal;

a bias generator having an input coupled to the storage circuit to generate a control signal having a voltage level based on the stored characteristic; and a variable delay circuit having a control terminal coupled to the bias generator, the variable delay adjusting a time delay according to the voltage level of the control signal to be the first time delay.

26. The delay-locked loop of claim 25 wherein the sample control circuit comprises a counter circuit coupled to the output of the input delay to count a number of clock cycles and generate a sample control signal causing the frequency detector to sample the frequency of the buffered clock signal in response to counting a threshold number of clock cycles.

27. The delay-locked loop of claim 25 wherein the sample control circuit comprises a frequency divider circuit coupled to the output of the input delay to generate a frequency divided clock signal applied to the frequency detector as the sample control signal causing the frequency detector to sample the frequency of the buffered clock signal.

28. The delay-locked loop of claim 21 wherein the model time delay comprises:

a first model time delay circuit having a time delay equal to a time delay of the input delay, and a second model time delay having a time delay equal to a time delay of the output delay.

29. The delay-locked loop of claim 21 wherein the variable delay line comprises the first adjustable delay portion coupled to the output of the input buffer, and the second adjustable delay portion coupled to the first adjustable delay portion to receive the buffered clock signal delayed by the first time delay and provide a clock signal delayed by the first and second time delays.

30. The delay-locked loop of claim 21 wherein the variable delay line comprises the second adjustable delay portion coupled to the output of the input buffer, and the first adjustable delay portion coupled to the second adjustable delay portion to receive the buffered clock signal delayed by the second time delay and provide a clock signal delayed by the first and second time delays.

31. The delay-locked loop of claim 21 wherein the output delay comprises a delay equal to a propagation delay of a data path through which data is provided to a data bus coupled to the output of the data path.

32. A memory device, comprising:

an address bus;

a control bus;

a data bus;

an address decoder coupled to the address bus;

a read/write circuit coupled to the data bus;

a control circuit coupled to the control bus;

a memory-cell array coupled to the address decoder, control circuit, and read/write circuit;

a delay-locked loop coupled to at least the control circuit and adapted to receive an input clock signal, the delay-locked loop generating an output clock signal synchronized with the input clock signal, the delay-locked loop comprising:

an input delay having an input at which the input clock signal is applied and an output at which a first skewed clock signal is provided;

an output delay having an input at which a pre-skewed clock signal is applied and an output at which the output clock signal is provided; and a variable delay circuit having an input coupled to the output of the input delay and an output coupled to the input of the output delay to provide the pre-skewed clock signal, the variable delay circuit having a frequency dependent variable delay portion providing a time delay based on the frequency of the first skewed clock signal and further having a phase dependent variable delay portion for providing a time delay to compensate for timing skew introduced by the input delay, the frequency dependent variable delay portion, and the output delay.

33. The memory device of claim 32 wherein the frequency dependent variable delay portion of the delay-locked loop comprises:

a frequency detector having an input coupled to the output of the input delay and having an output at which a frequency reference signal is provided, the frequency reference signal generated by the frequency detector indicative of an input clock frequency;

a bias generator having an input coupled to the output of the frequency detector to generate a control signal having a voltage level based on the frequency reference signal, the control signal provided at an output of the bias generator; and an adjustable delay circuit having a control terminal coupled to the output of the bias generator, the adjustable delay circuit adjusting a time delay according to the voltage level of the control signal to be the time delay of the frequency dependent variable delay portion.

34. The delay-locked loop of claim 33 wherein the frequency reference signal comprises a current signal having a current magnitude based on the frequency of the input clock signal and the bias generator comprises:

a current latch to latch the current magnitude of the frequency reference signal; and a conversion circuit coupled to the current latch to generate a control signal having a voltage level based on the latched current magnitude.

35. The delay-locked loop of claim 33 wherein the frequency reference signal comprises an analog signal indicative of the input clock frequency and the bias generator comprises:

an analog-to-digital converter to convert the frequency reference signal into a digital value;

a register coupled to the analog-to-digital converter to store the digital value; and a digital-to-analog converter coupled to the register to convert the digital value into a control signal having a voltage level based on the stored digital value.

36. The memory device of claim 32 wherein the frequency dependent variable delay portion of the delay-locked loop comprises:

a frequency detector having an input coupled to the output of the input delay circuit, having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;

a sample control circuit for generating a sample control signal to cause the frequency detector to sample the frequency of the buffered clock signal;

a storage circuit for storing the characteristic of the frequency reference signal;

a bias generator having an input coupled to the storage circuit to generate a control signal having a voltage level based on the stored characteristic; and an adjustable delay circuit having a control terminal coupled to the bias generator, the adjustable delay circuit adjusting a time delay according to the voltage level of the control signal to be provided as the first time delay.

37. The memory device of claim 32 wherein the variable delay circuit of the delay-locked loop comprises the frequency dependent variable delay portion coupled to the output of the input delay, and the phase controlled adjustable delay circuit coupled to the frequency dependent variable delay portion to receive the first skewed clock signal delayed by the frequency dependent variable delay portion and provide the pre-skewed clock signal to the output delay.

38. The memory device of claim 32 wherein the variable delay circuit of the delay-locked loop comprises the phase dependent variable delay portion coupled to the output of the input delay, and the frequency dependent variable delay portion coupled to the phase dependent variable delay portion to receive the first skewed clock signal delayed by the phase dependent variable delay portion and provide the pre-skewed clock signal to the output delay.

39. The memory device of claim 32 wherein the output delay of the delay-locked loop comprises a delay equal to a propagation delay of a data path through which data is provided to a data bus coupled to the output of the data path.

40. A memory device, comprising:

an address bus;

a control bus;

a data bus;

an address decoder coupled to the address bus;

a read/write circuit coupled to the data bus;

a control circuit coupled to the control bus;

a memory-cell array coupled to the address decoder, control circuit, and read/write circuit;

a clock signal generator coupled to at least the control circuit and adapted to receive an input clock signal, the clock signal generator generating an output clock signal synchronized with the input clock signal having an input clock frequency, the clock signal generator comprising:

a frequency dependent variable delay circuit having an input at which a buffered clock signal is applied and having an output at which a first delayed clock signal is provided, the buffered clock signal having a frequency equal to the input clock frequency and skewed with respect to the input clock signal by a first phase difference, the first delayed clock signal delayed with respect to the buffered clock signal by a time delay based on the frequency of the buffered clock signal; and a phase dependent variable delay circuit having a first input coupled to the output of the frequency dependent variable delay and having an output at which a pre-skewed clock signal is provided, the pre-skewed clock signal delayed with respect to the first delayed clock signal by a time delay based on the phase difference between the buffered clock signal and a delayed version of the pre-skewed clock signal further delayed by a model time delay having an input delay portion and an output delay portion, the pre-skewed clock signal leading the output clock signal by the time delay of the output delay portion.

41. The memory device of claim 40 wherein the frequency dependent variable delay circuit of the clock signal generator comprises:

a frequency detector having an input at which the buffered clock is coupled and having an output at which a frequency reference signal is provided, the frequency reference signal generated by the frequency detector indicative of the input clock frequency;

a bias generator having an input coupled to the output of the frequency detector to generate a control signal having a voltage level based on the frequency reference signal, the control signal provided at an output of the bias generator; and a variable delay circuit having a control terminal coupled to the output of the bias generator, the variable delay circuit adjusting a time delay according to the voltage level of the control signal to be the time delay of the frequency dependent variable delay.

42. The memory device of claim 41 wherein the frequency reference signal comprises a current signal having a current magnitude based on the frequency of the input clock signal and the bias generator comprises:

a current latch to latch the current magnitude of the frequency reference signal; and a conversion circuit coupled to the current latch to generate a control signal having a voltage level based on the latched current magnitude.

43. The memory device of claim 41 wherein the frequency reference signal comprises an analog signal indicative of the input clock frequency and the bias generator comprises:

an analog-to-digital converter to convert the frequency reference signal into a digital value;

a register coupled to the analog-to-digital converter to store the digital value; and a digital-to-analog converter coupled to the register to convert the digital value into a control signal having a voltage level based on the stored digital value.

44. The memory device of claim 40 wherein the frequency dependent variable delay circuit of the clock signal generator comprises:

a frequency detector coupled to receive the buffered clock signal and having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;

a sample control circuit for generating a sample control signal to cause the frequency detector to sample the frequency of the buffered clock signal;

a storage circuit for storing the characteristic of the frequency reference signal;

a bias generator having an input coupled to the storage circuit to generate a control signal having a voltage level based on the stored characteristic; and a variable delay circuit having a control terminal coupled to the bias generator, the variable delay adjusting a time delay according to the voltage level of the control signal to the time delay of the frequency dependent variable delay circuit.

45. A computer system, comprising:

a data input device;

a data output device;

a processor coupled to the data input and output devices; and a memory device coupled to the processor, the memory device comprising, an address bus;

a control bus;

a data bus;

an address decoder coupled to the address bus;

a read/write circuit coupled to the data bus;

a control circuit coupled to the control bus;

a memory-cell array coupled to the address decoder, control circuit, and read/write circuit;

a delay-locked loop coupled to at least the control circuit and adapted to receive an input clock signal, the delay-locked loop generating an output clock signal synchronized with the input clock signal, the delay-locked loop comprising:

an input delay having an input at which the input clock signal is applied and an output at which a first skewed clock signal is provided;

an output delay having an input at which a preskewed clock signal is applied and an output at which the output clock signal is provided; and a variable delay circuit having an input coupled to the output of the input delay and an output coupled to the input of the output delay to provide the pre-skewed clock signal, the variable delay circuit having a frequency dependent variable delay portion providing a time delay based on the frequency of the first skewed clock signal and further having a phase dependent variable delay portion for providing a time delay to compensate for timing skew introduced by the input delay, the frequency dependent variable delay portion, and the output delay.

46. The computer system of claim 45 wherein the frequency dependent variable delay portion of the delay-locked loop comprises:

a frequency detector having an input coupled to the output of the input delay and having an output at which a frequency reference signal is provided, the frequency reference signal generated by the frequency detector indicative of an input clock frequency;

a bias generator having an input coupled to the output of the frequency detector to generate a control signal having a voltage level based on the frequency reference signal, the control signal provided at an output of the bias generator; and an adjustable delay circuit having a control terminal coupled to the output of the bias generator, the adjustable delay circuit adjusting a time delay according to the voltage level of the control signal to be the time delay of the frequency dependent variable delay portion.

47. The computer system of claim 46 wherein the frequency reference signal comprises a current signal having a current magnitude based on the frequency of the input clock signal and the bias generator comprises:

a current latch to latch the current magnitude of the frequency reference signal; and a conversion circuit coupled to the current latch to generate a control signal having a voltage level based on the latched current magnitude.

48. The computer system of claim 46 wherein the frequency reference signal comprises an analog signal indicative of the input clock frequency and the bias generator comprises:

an analog-to-digital converter to convert the frequency reference signal into a digital value;

a register coupled to the analog-to-digital converter to store the digital value; and a digital-to-analog converter coupled to the register to convert the digital value into a control signal having a voltage level based on the stored digital value.

49. The computer system of claim 45 wherein the frequency dependent variable delay portion of the delay-locked loop comprises:

a frequency detector having an input coupled to the output of the input delay circuit, having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;

a sample control circuit for generating a sample control signal to cause the frequency detector to sample the frequency of the buffered clock signal;

a storage circuit for storing the characteristic of the frequency reference signal;

a bias generator having an input coupled to the storage circuit to generate a control signal having a voltage level based on the stored characteristic; and an adjustable delay circuit having a control terminal coupled to the bias generator, the adjustable delay circuit adjusting a time delay according to the voltage level of the control signal to be provided as the first time delay.

50. The computer system of claim 45 wherein the variable delay circuit of the delay-locked loop comprises the frequency dependent variable delay portion coupled to the output of the input delay, and the phase controlled adjustable delay circuit coupled to the frequency dependent variable delay portion to receive the first skewed clock signal delayed by the frequency dependent variable delay portion and provide the pre-skewed clock signal to the output delay.

51. The computer system of claim 45 wherein the variable delay circuit of the delay-locked loop comprises the phase dependent variable delay portion coupled to the output of the input delay, and the frequency dependent variable delay portion coupled to the phase dependent variable delay portion to receive the first skewed clock signal delayed by the phase dependent variable delay portion and provide the pre-skewed clock signal to the output delay.

52. The computer system of claim 45 wherein the output delay of the delay-locked loop comprises a delay equal to a propagation delay of a data path through which data is provided to a data bus coupled to the output of the data path.

53. A computer system, comprising:
   a data input device;
   a data output device;
   a processor coupled to the data input and output devices; and
   a memory device coupled to the processor, the memory device comprising,
      an address bus;
      a control bus;
      a data bus;
      an address decoder coupled to the address bus;
      a read/write circuit coupled to the data bus;
      a control circuit coupled to the control bus;
      a memory-cell array coupled to the address decoder, control circuit, and read/write circuit;
      a clock signal generator coupled to at least the control circuit and adapted to receive an input clock signal, the clock signal generator generating an output clock signal synchronized with the input clock signal having an input clock frequency, the clock signal generator comprising:
         a frequency dependent variable delay circuit having an input at which a buffered clock signal is applied and having an output at which a first delayed clock signal is provided, the buffered clock signal having a frequency equal to the input clock frequency and skewed with respect to the input clock signal by a first phase difference, the first delayed clock signal delayed with respect to the buffered clock signal by a time delay based on the frequency of the buffered clock signal; and
         a phase dependent variable delay circuit having a first input coupled to the output of the frequency dependent variable delay and having an output at which a pre-skewed clock signal is provided, the pre-skewed clock signal delayed with respect to the first delayed clock signal by a time delay based on the phase difference between the buffered clock signal and a delayed version of the pre-skewed clock signal further delayed by a model time delay having an input delay portion and an output delay portion, the pre-skewed clock signal leading the output clock signal by the time delay of the output delay portion.

54. The computer system of claim 53 wherein the frequency dependent variable delay circuit of the clock signal generator comprises:
   a frequency detector having an input at which the buffered clock is coupled and having an output at which a frequency reference signal is provided, the frequency reference signal generated by the frequency detector indicative of the input clock frequency;
   a bias generator having an input coupled to the output of the frequency detector to generate a control signal having a voltage level based on the frequency reference signal, the control signal provided at an output of the bias generator; and
   a variable delay circuit having a control terminal coupled to the output of the bias generator, the variable delay circuit adjusting a time delay according to the voltage level of the control signal to be the time delay of the frequency dependent variable delay.

55. The computer system of claim 54 wherein the frequency reference signal comprises a current signal having a current magnitude based on the frequency of the input clock signal and the bias generator comprises:
   a current latch to latch the current magnitude of the frequency reference signal; and
   a conversion circuit coupled to the current latch to generate a control signal having a voltage level based on the latched current magnitude.

56. The computer system of claim 54 wherein the frequency reference signal comprises an analog signal indicative of the input clock frequency and the bias generator comprises:
   an analog-to-digital converter to convert the frequency reference signal into a digital value;
   a register coupled to the analog-to-digital converter to store the digital value; and
   a digital-to-analog converter coupled to the register to convert the digital value into a control signal having a voltage level based on the stored digital value.

57. The computer system of claim 51 wherein the frequency dependent variable delay circuit of the clock signal generator comprises:
   a frequency detector coupled to receive the buffered clock signal and having an output at which a frequency reference signal is provided, and further having a sample control terminal at which a sample control signal is applied, in response to the sample control signal, the frequency detector sampling the frequency of the buffered clock signal and generating the frequency reference signal having a characteristic indicative of the input clock frequency;
   a sample control circuit for generating a sample control signal to cause the frequency detector to sample the frequency of the buffered clock signal;
   a storage circuit for storing the characteristic of the frequency reference signal;
   a bias generator having an input coupled to the storage circuit to generate a control signal having a voltage level based on the stored characteristic; and
   a variable delay circuit having a control terminal coupled to the bias generator, the variable delay adjusting a time delay according to the voltage level of the control signal to the time delay of the frequency dependent variable delay circuit.

58. A method of generating a synchronized clock signal synchronized with an input clock signal propagated through an input delay and an output delay, the input clock signal having an input clock frequency, the method comprising:
   sampling the frequency of the input buffered clock signal;
   generating a delay control signal having a characteristic indicative of the frequency of the input buffered clock signal;
   storing data representative of the characteristic of the delay control signal;
   based on the stored data, reading the stored data and adjusting a variable delay to provide a first time delay;
   delaying an input buffered clock signal by the first time delay to provide a first delayed clock signal, the buffered clock signal skewed from the input clock signal by an input delay; and delaying the first delayed clock signal by a second time delay based on the phase difference between the buffered clock signal and a feedback clock signal, the feedback clock signal delayed from the first delayed clock signal further delayed by the second time delay by a model time delay, the model time delay representative of the time delay of the input and output delays.

59. The method of claim 58 wherein generating a delay control signal comprises generating a bias signal having a voltage level indicative of the frequency of the input buffered clock signal and adjusting a variable delay comprises adjusting an impedance of a voltage controlled impedance device coupling a delay circuit to a power supply.

60. A method for generating a clock signal synchronized with an input clock signal propagated through an input delay and an output delay, the method comprising:

sampling the frequency of an input buffered clock signal;

generating a delay control signal having a characteristic indicative of the frequency of the input buffered clock signal;

storing data representative of the characteristic of the delay control signal;

based on the stored data, adjusting a variable delay to provide a first time delay;

delaying the input buffered clock signal by the first time delay; and further delaying the delayed input, buffered clock signal by a second time delay to compensate for timing skew introduced by the input delay, the output delay and the process of delaying the input buffered clock signal.

61. The method of claim 60 wherein generating a delay control signal comprises generating a bias signal having a voltage level indicative of the frequency of the input buffered clock signal and adjusting a variable delay comprises adjusting an impedance of a voltage controlled impedance device coupling a delay circuit to a power supply.

62. The method of claim 60 wherein delaying the input buffered clock signal by the second time delay occurs before delaying the input buffered clock signal by the first time delay.

63. The method of claim 60 wherein delaying the input buffered clock signal by the first time delay occurs before delaying the input buffered clock signal by the second time delay.

64. A method for generating a clock signal synchronized to an input clock signal propagated through an input delay and propagated through an output delay, the method comprising:

sampling the frequency of an input buffered clock signal having a delay relative to the input clock signal equal to the input delay;

generating a delay control signal having a characteristic indicative of the frequency of the input buffered clock signal;

storing data representative of the characteristic of the delay control signal;

based on the stored data, adjusting a variable delay to provide a time delay;

generating a frequency scaled clock signal having a delay relative to the input buffered clock signal equal to the time delay;

delaying the frequency scaled clock signal by a second time delay;

adjusting the second time delay based on the phase difference between the buffered clock signal and a feedback clock signal, the feedback clock signal delayed with respect to the delay compensated clock signal by a model time delay equal the total delay of the input delay and the output delay.

65. The method of claim 64 wherein generating a delay control signal comprises generating a bias signal having a voltage level indicative of the frequency of the input buffered clock signal and adjusting a variable delay comprises adjusting an impedance of a voltage controlled impedance device coupling a delay circuit to a power supply.

* * * * *

UNITED STATES PATENT AND TRADEMARK OFFICE
CERTIFICATE OF CORRECTION

PATENT NO. : 6,937,076 B2  Page 1 of 2
APPLICATION NO. : 10/459851
DATED : August 30, 2005
INVENTOR(S) : Tyler J. Gomm It is certified that error appears in the above-identified patent and that said Letters Patent is hereby corrected as shown below:

| Column, Line | Reads | Should Read |
|---|---|---|
| Column 2, Line 30 | "represent all of" | --represent all of the-- |
| Column 3, Line 20 | "delay VD as a value" | --delay VD has a value-- |
| Column 3, Line 63 | "each cycle of the CLK" | --at each cycle of the CLK-- |
| Column 4, Line 64 | "device at lower clock frequency" | --device at a lower clock frequency-- |
| Column 5, Line 42 | "maximum operation frequency" | --maximum operating frequency-- |
| Column 7, Line 12 | "108 represents all" | --108 represent all-- |
| Column 7, Line 20 | "some degree is frequency" | --some degree frequency-- |
| Column 9, Line 10 | "and will be illustrated" | --and as will be illustrated-- |
| Column 11, Line 7 | "will have voltage level" | --will have a voltage level-- |
| Column 11, Line 48 | "which in turn, adjusts" | --which in turn adjusts-- |
| Column 13, Line 8 | "understanding those ordinarily" | --understanding of those ordinarily-- |
| Column 14, Line 14 | "provides 64 bits" | --provides 64 bits-- |
| Column 14, Line 15 | "two 32 bits words" | --two 32 bit words-- |
| Column 14, Line 24 | "received N/2 bits words" | --received N/2 bit words-- |

UNITED STATES PATENT AND TRADEMARK OFFICE
CERTIFICATE OF CORRECTION

PATENT NO. : 6,937,076 B2
APPLICATION NO. : 10/459851
DATED : August 30, 2005
INVENTOR(S) : Tyler J. Gomm It is certified that error appears in the above-identified patent and that said Letters Patent is hereby corrected as shown below:

| Column, Line | Reads | Should Read |
|---|---|---|
| Column 17, Line 4 | "of the input delay, and" | --of the input delay; and-- |
| Column 28, Line 27 | "of claim 51 wherein" | --of claim 53 wherein-- |
| Column 29, Line 28 | "delayed input, buffered" | --delayed input buffered-- |
| Column 30, Line 32 | "delay equal the total" | --delay equal to the total-- |

Signed and Sealed this

Sixth Day of November, 2007

JON W. DUDAS
*Director of the United States Patent and Trademark Office*